US007031509B2

(12) United States Patent
Narita et al.

(10) Patent No.: US 7,031,509 B2
(45) Date of Patent: Apr. 18, 2006

(54) METHOD AND APPARATUS FOR CORRECTING INCLINATION OF IC ON SEMICONDUCTOR WAFER

(75) Inventors: Shoriki Narita, Hirakata (JP); Masahiko Ikeya, Sakai (JP); Yasutaka Tsuboi, Hirakata (JP); Takaharu Mae, Hirakata (JP); Shinji Kanayama, Kashihara (JP)

(73) Assignee: Matsushita Electric Industrial Co., Ltd., Osaka-Fu (JP)

( * ) Notice: Subject to any disclaimer, the term of this patent is extended or adjusted under 35 U.S.C. 154(b) by 656 days.

(21) Appl. No.: 09/988,704

(22) Filed: Nov. 20, 2001

(65) Prior Publication Data

US 2002/0061129 A1 May 23, 2002

(30) Foreign Application Priority Data

Nov. 21, 2000 (JP) ............................. 2000-354471

(51) Int. Cl.
*G06K 9/00* (2006.01)

(52) U.S. Cl. ............... 382/145; 382/151; 257/E23.179; 438/460

(58) Field of Classification Search ............... 382/100, 382/141, 145, 199, 195, 190, 181, 287, 286, 382/289, 297, 305, 312, 151; 438/5, 14, 438/16, 460, 612, 613, 614, 617, 652; 257/E23.179; 250/559.01, 559.03; 356/237.1, 237.2, 237.4, 356/237.5

See application file for complete search history.

(56) References Cited

U.S. PATENT DOCUMENTS

| 4,929,893 | A | * | 5/1990 | Sato et al. .................. 324/758 |
| 5,119,168 | A | * | 6/1992 | Misawa ...................... 257/691 |
| 5,566,876 | A | * | 10/1996 | Nishimaki et al. .......... 228/102 |
| 5,644,245 | A | * | 7/1997 | Saitoh et al. ............... 324/754 |
| 6,070,783 | A | * | 6/2000 | Nakazato .................... 228/105 |
| 6,193,132 | B1 | * | 2/2001 | Shibata et al. ............. 228/103 |
| 6,284,568 | B1 | * | 9/2001 | Yamamoto .................. 438/108 |
| 6,445,203 | B1 | * | 9/2002 | Yamashita et al. .......... 324/760 |
| 6,476,499 | B1 | * | 11/2002 | Hikita et al. ................ 257/777 |

* cited by examiner

Primary Examiner—Sheela Chawan

(74) Attorney, Agent, or Firm—Wenderoth, Lind & Ponack, L.L.P.

(57) ABSTRACT

There are provided a recognition device, a wafer turning member, a turning device, and a control device. A first detection point for recognition and a second detection point for recognition are recognized, on the basis of the result of which a semiconductor wafer is turned to correct the inclination of ICs on the semiconductor wafer. As a result, the recognition operation for detecting the inclination of the ICs when a position of the ICs is to be recognized for bump formation is eliminated. The number of times the recognition is performed is reduced in comparison with the conventional art, so that the productivity can be improved.

15 Claims, 18 Drawing Sheets

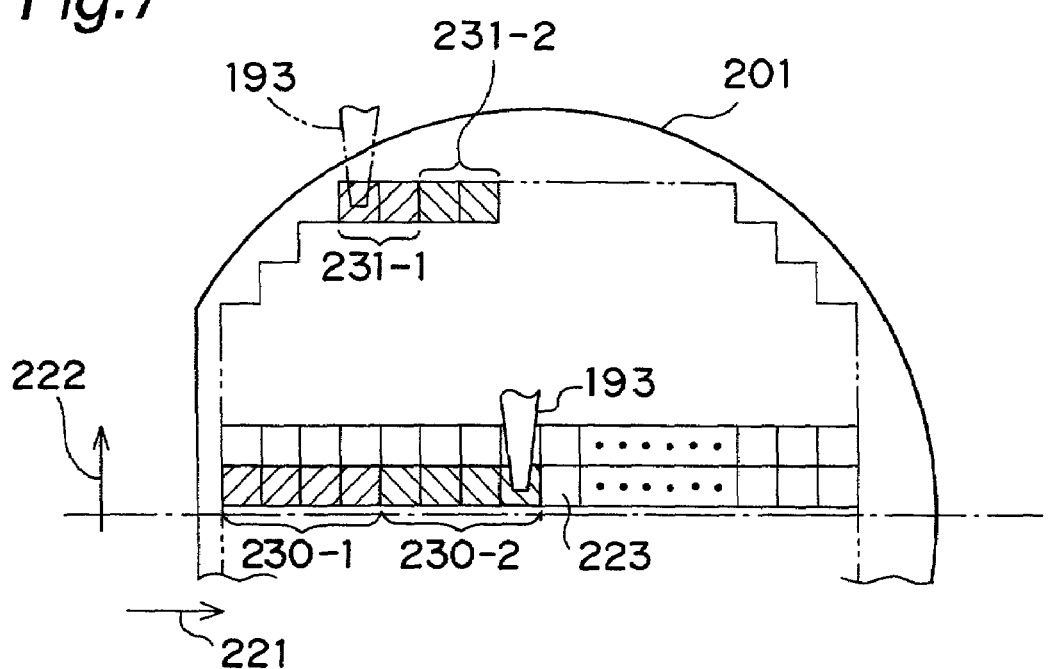
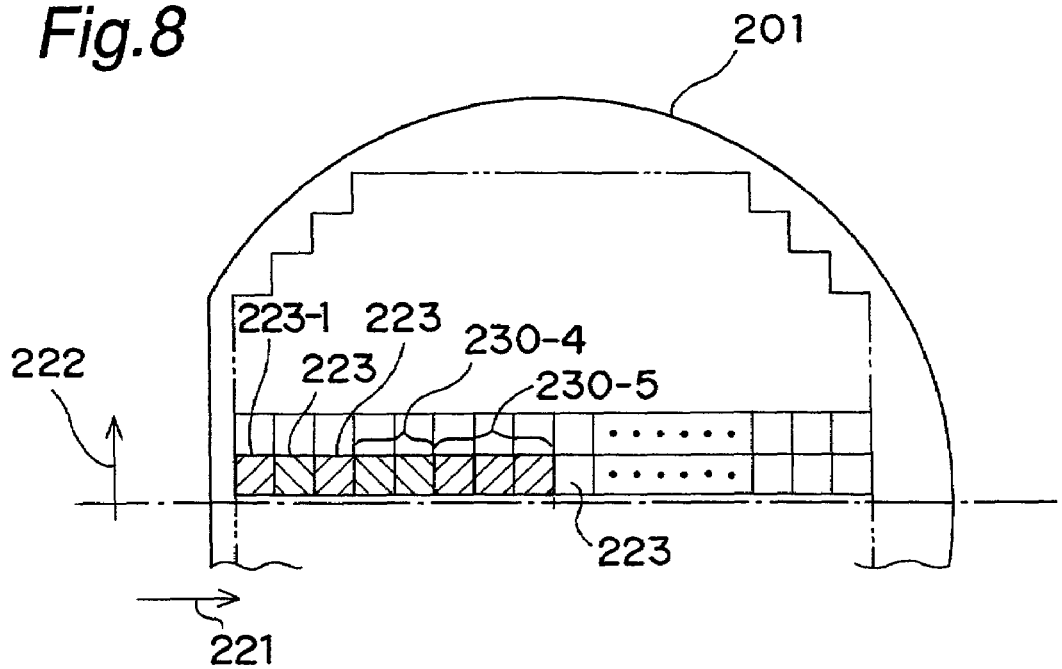

METHOD AND APPARATUS FOR CORRECTING INCLINATION OF IC ON SEMICONDUCTOR WAFER

BACKGROUND OF THE INVENTION

The present invention relates to a method for correcting the inclination of each IC formed on a semiconductor wafer before bumps are formed onto electrodes of the IC, and an IC inclination-correcting apparatus for executing the method.

Conventionally in forming bumps onto electrodes of ICs (integrated circuits), bumps have been formed to every one of the IC chips (i.e., individual pieces cut one-by-one from a semiconductor wafer). The conventional bump formation method is inferior in productivity because it requires a transfer time for each individual piece to a bump bonding apparatus to form bumps. For shortening the transfer time, an arrangement of transferring the semiconductor wafer to the bump bonding apparatus to form bumps to the ICs on the semiconductor wafer has come to be carried out.

When bumps are to be formed to ICs on the semiconductor wafer, it is necessary to recognize positions of the ICs to form bumps onto electrodes of the ICs. The semiconductor wafer itself is heated to approximately 150–200° C. when bumps are formed, and the heat affects the bump bonding apparatus as well, e.g., thermally expands the apparatus or the like. As such, a mark for position recognition formed on each IC has been conventionally imaged by a recognition camera for every IC before the bumps are formed to each IC, thereby correcting the position of the semiconductor wafer.

The semiconductor wafer has, for example, nearly 3000–10000 ICs formed thereon. The larger the number of ICs is, the more time it takes for the position recognition to form bumps. While for instance, 2–4 bumps are formed to each IC, forming one bump takes approximately 60–80 msec. On the other hand, recognizing one position recognition mark requires approximately 200–250 msec. Since two position recognition marks should be recognized for every IC, the time required for the position recognition is considerably long as compared with the time for forming bumps, resulting in deteriorating productivity.

Meanwhile, in the bump forming apparatus of the conventional art, an operation for correcting an inclination of the ICs by detecting the inclination of the ICs formed on the semiconductor wafer and turning the semiconductor wafer has not been carried out from a viewpoint of improving the productivity.

SUMMARY OF THE INVENTION

The present invention is devised to solve the above-described disadvantage and has for its object to provide a method and an apparatus for correcting the inclination of the ICs on the semiconductor wafer whereby the productivity in forming bumps to the semiconductor wafer is improved in comparison with the conventional art.

In accomplishing this and other objectives, according to a first aspect of the present invention, a method for correcting the inclination of ICs on semiconductor wafer is provided, comprises:

recognizing a first detection point for recognition and a second detection point for recognition on the semiconductor wafer by moving an image pickup camera along mutually orthogonal X and Y directions;

correcting an inclination of all ICs on the semiconductor wafer with respect to the X and Y directions by turning the semiconductor wafer on a basis of a result of the recognition instead of correcting an inclination for each of the ICs on the semiconductor wafer.

When the first detection point for recognition deviates within a deviation area beyond a view field of the image pickup camera, the first detection point for recognition can be detected by moving the view field of the image pickup camera in a serpentine manner in the X and Y directions within the deviation area starting from one point among four corners of the deviation area.

When the first detection point for recognition deviates within a deviation area beyond a view field of the image pickup camera, the first detection point for recognition can be detected by moving the view field of the image pickup camera spirally in the X and Y directions within the deviation area starting from a center in the deviation area.

Each quantity of movement in the X and Y directions of the view field of the image pickup camera may be ⅓ a length with respect to the X and Y directions of the view field.

The method for correcting the inclination of ICs on semiconductor wafer may be designed so that the method further comprises:

recognizing a detection point for inclination correction which is included in the view field of the image pickup camera together with the first detection point for recognition in addition to the recognition of the first detection point for recognition;

obtaining a rough inclination of the ICs on the basis of the recognition of the first detection point for recognition and the detection point for inclination correction; and recognizing the second detection point for recognition by moving the image pickup camera on the basis of the rough inclination.

An apparatus for correcting inclination of ICs on a semiconductor wafer provided according to a second aspect of the present invention comprises:

a recognition device which includes an image pickup camera freely movable in mutually orthogonal X and Y directions above the semiconductor wafer for imaging a first detection point for recognition and a second detection point for recognition on the semiconductor wafer, and detects an inclination of ICs on the semiconductor wafer with respect to the X and Y directions on a basis of pickup image information obtained by the image pickup camera;

a wafer turning member on which the semiconductor wafer is loaded and which is turned in a circumferential direction of the loaded semiconductor wafer;

a turning device for turning the wafer turning member in the circumferential direction; and a control device for controlling to drive the turning device on the basis of inclination information of the ICs detected by the recognition device so as to turn the semiconductor wafer loaded on the wafer turning member in order to correct the inclination of all ICs on the semiconductor wafer instead of correcting an inclination for each of the ICs on the semiconductor wafer.

In the IC inclination correcting apparatus, when the first detection point for recognition deviates within a deviation area beyond a view field of the image pickup camera, the control device can control to drive the recognition device to detect the first detection point for recognition by moving the view field of the image pickup camera in a serpentine manner in the X and Y directions within the deviation area starting from one point among four corners of the deviation area.

In the IC inclination correcting apparatus, when the first detection point for recognition deviates within a deviation area beyond a view field of the image pickup camera, the control device can control to drive the recognition device to detect the first detection point for recognition by moving the view field of the image pickup camera spirally in the X and Y directions within the deviation area starting from a center in the deviation area.

In the IC inclination correcting apparatus, the control device can define each quantity of the movements in the X and Y directions of the view field of the image pickup camera to be ⅓ a length with respect to the X and Y directions of the view field.

In the IC inclination correcting apparatus, the control device can control to drive the recognition device to recognize not only the first detection point for recognition, but a detection point for inclination correction which is included in the view field of the image pickup camera together with the first detection point for recognition, to obtain a rough inclination of the ICs based on the first detection point for recognition and the detection point for inclination correction, and to detect the second detection point for recognition by moving the image pickup camera based on the rough inclination.

According to the IC inclination correction method of the first aspect and the IC inclination correcting apparatus of the second aspect of the present invention as detailed above, there are provided the recognition device, the wafer turning member, the turning device, and the control device. The first detection point for recognition and the second detection point for recognition are recognized. Then the semiconductor wafer is turned on the basis of the recognition result of the first and second detection points for recognition, thereby correcting the inclination of all ICs on the semiconductor wafer in place of correcting an inclination for each of the ICs on the semiconductor wafer. Therefore, the recognition operation for detecting the inclination of the ICs can be eliminated when the position recognition for bump formation with respect to the ICs is carried out. The number of times that the recognition is reduced in comparison with the conventional art and the productivity can be improved accordingly.

The manner of detecting the first detection point for recognition by moving the view field in the serpentine fashion in the deviation area facilitates definition of a region where the view field is to be moved and moving the view field. Also, the manner of spirally moving the view field inside the deviation area enables the first detection point for recognition to be detected early in the case where the first detection point for recognition is highly possibly present at the central part of the deviation area.

The quantity of the movement of the view field is most preferably ⅓ of the view field from a relationship between a size of the view field and a size of the first detection point for recognition.

When the first detection point for recognition and the detection point for inclination correction are arranged in the same view field of the image pickup camera, both detection points can be recognized by one recognition operation. The rough inclination angle of the ICs formed on the semiconductor wafer can be obtained on the basis of the detection points. Moreover, since the second detection point for recognition is detected by moving the image pickup camera on the basis of the above rough inclination angle, the second detection point for recognition can be detected in a short time in comparison with the case where the second detection point for recognition present on the semiconductor wafer is searched for without any hint or clue. The productivity can be accordingly improved more.

BRIEF DESCRIPTION OF DRAWINGS

These and other aspects and features of the present invention will become clear from the following description taken in conjunction with the preferred embodiment thereof with reference to the accompanying drawings, in which:

FIG. 7 is a diagram for explaining changes in the number of ICs for defining the basic block in accordance with a bump formation position on the semiconductor wafer for the basic block of FIG. 4;

FIG. 8 is a diagram for explaining changes in the number of ICs for defining the basic block for the basic block of FIG. 4;

DETAILED DESCRIPTION OF THE PREFERRED EMBODIMENTS

Figure 1:
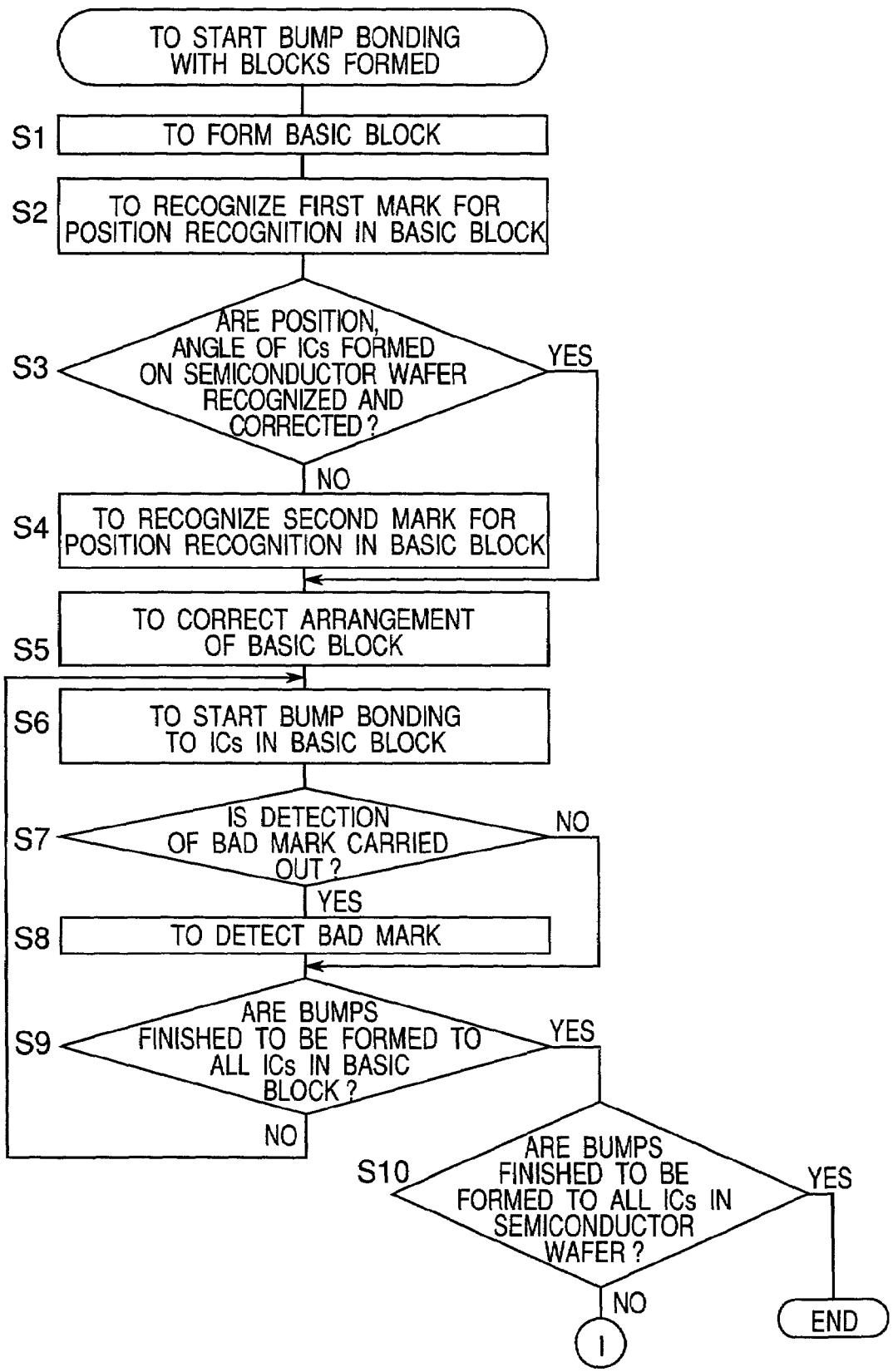
FIG. 1 is a flow chart showing operations of a bump formation method in the preferred embodiment of the present invention.

A method for correcting the inclination of ICs formed on a semiconductor wafer, and an IC inclination-correcting apparatus for executing the method according to the preferred embodiment of the present invention will be described hereinbelow with reference to the drawings in which like parts are designated by like reference numerals. All of the ICs (integrated circuits) formed on the semiconductor wafer are equal in size and in shape. The manner of forming the ICs onto the semiconductor wafer is not specified and can be either forming the ICs to an entire face including a circumferential edge part of the semiconductor wafer, or refraining from forming the ICs to a marginal part when the marginal part is provided to the circumferential edge part.

In order to accomplish the above-described objective of improving the productivity in forming bumps to the semiconductor wafer as compared with the conventional art, roughly, a first to a third points below are intended in the bump formation method to the semiconductor wafer.

First, one block is defined imaginarily of a plurality of ICs (integrated circuits) formed on the semiconductor wafer. Position recognition is carried out in every unit of the block by recognizing two marks for position recognition included in each block, and position recognition is omitted when bumps are formed to each of the ICs included in the block. The number of times of performing the recognition is thus reduced in comparison with the conventional art, so that the productivity is improved.

Secondly, the recognition of two marks for position recognition in the block is reduced to one mark, thereby improving the productivity even more.

Thirdly, the presence/absence of bad marks applied to ICs on the semiconductor wafer, or the ICs not functioning as ICs (i.e., defective ICs) is determined, so that bumps are not formed to the defective ICs. Thus the productivity is much further improved.

Figure 29:
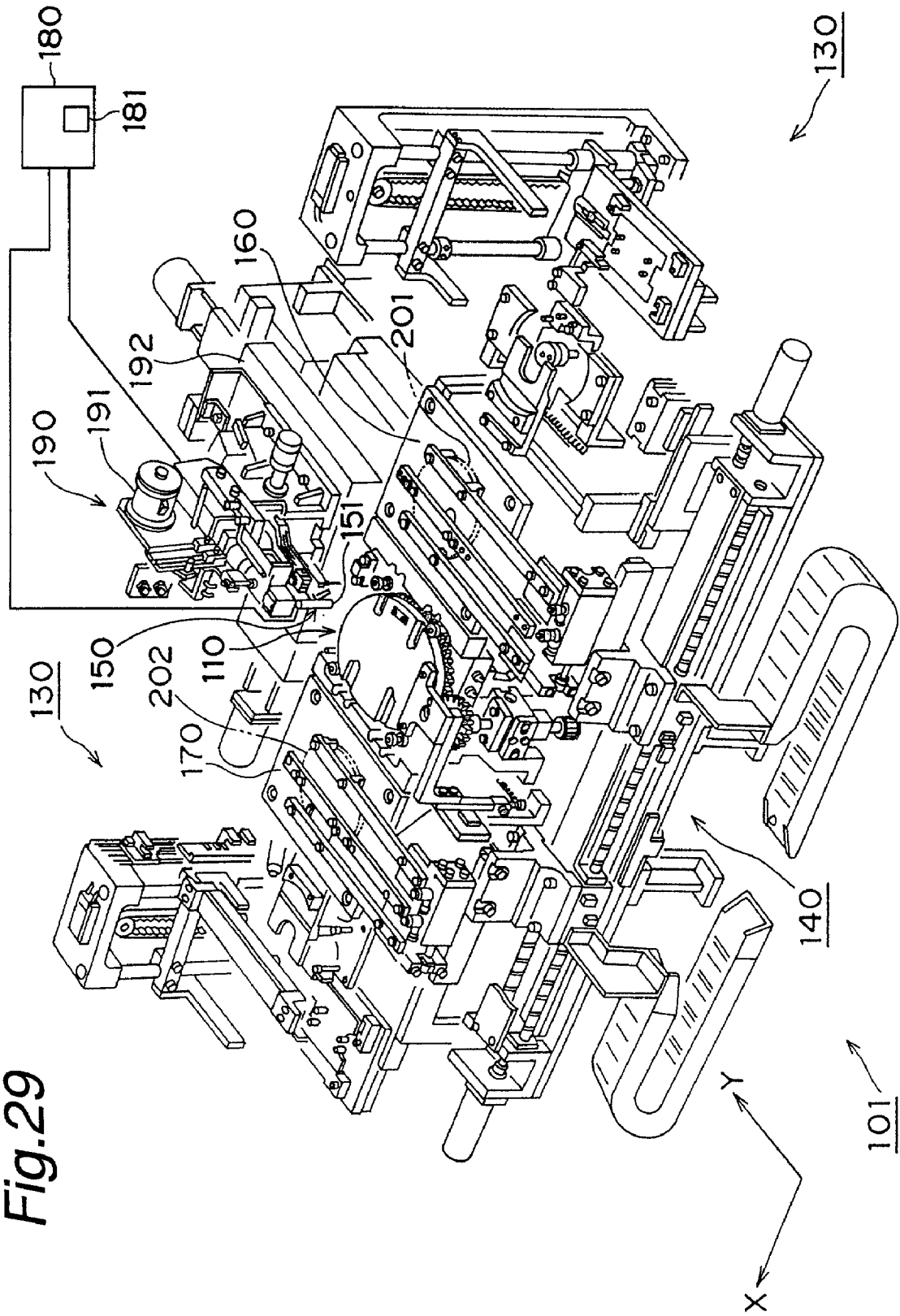
FIG. 29 is a perspective view of a bump forming apparatus in the embodiment for executing the bump formation method of FIG. 1.

The bump forming apparatus to a semiconductor wafer which carries out the above bump formation method to the semiconductor wafer is schematically shown in FIG. 29. The bump forming apparatus 101 comprises one heating device 110 for bump bonding, a recognition device 150, a control device 180, and one bump forming head 190 corresponding to one example of a bump bonding apparatus. The bump forming apparatus preferably includes carriers 130, transfer devices 140 arranged respectively to the carry-in side and the carry-out side, a preheating device 160, and a postheating device 170.

Further, the apparatus for correcting an IC inclination can be constituted of a wafer turning member 111 and a turning device 112 to be described later which are connected to the heating device 110, the recognition device 150, and the control device 180.

Figure 30:
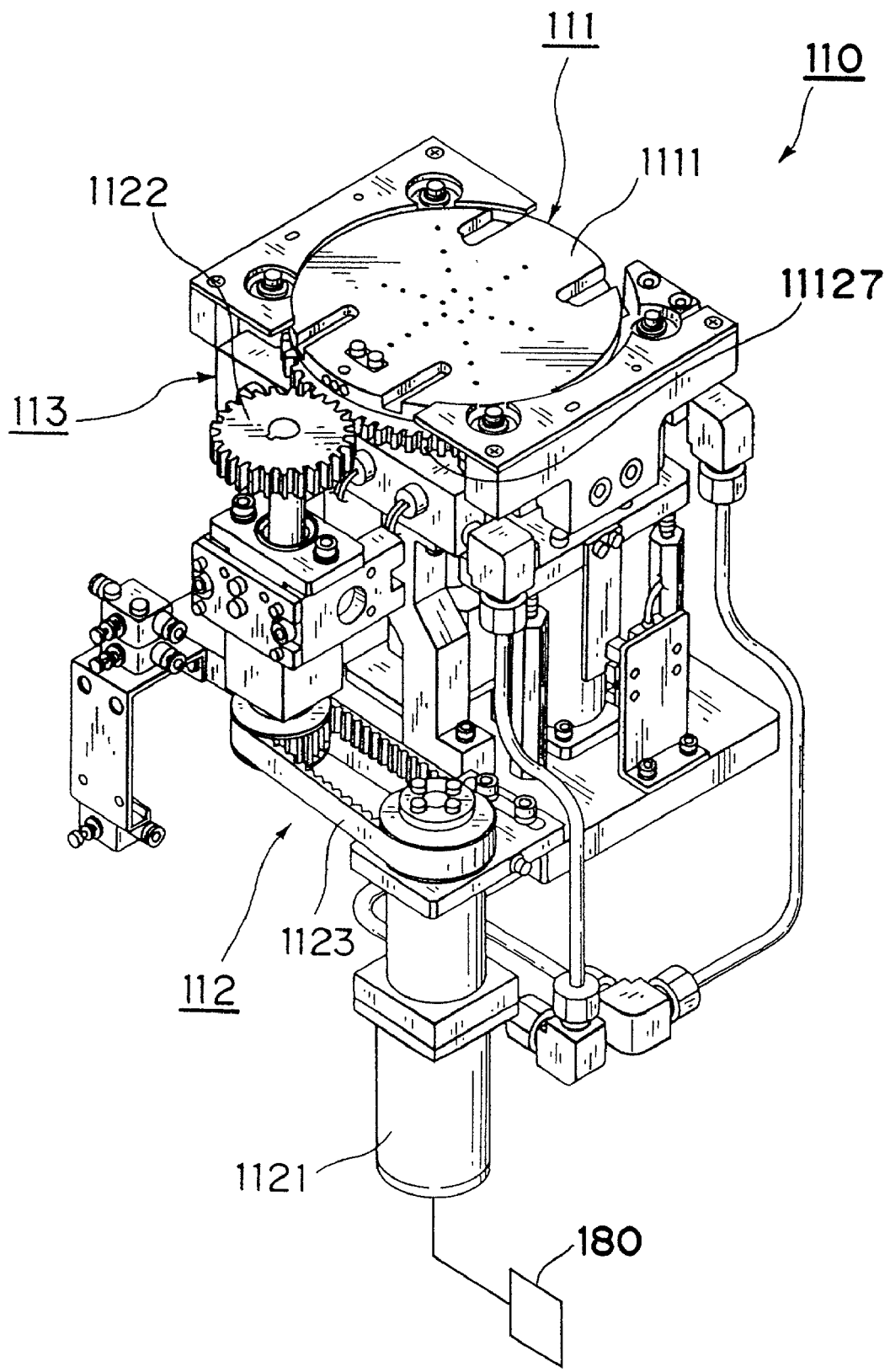
FIG. 30 is a perspective view of a heating device for bonding shown in FIG. 29.

The heating device 110 for bump bonding is roughly comprised of, as shown in FIG. 30, a wafer turning member 111, a turning device 112, and a wafer heater 113. The heating device 110 holds a semiconductor wafer 201 onto the wafer turning member 111, and the wafer 201 is without bumps formed yet and is to be subjected to bump bonding. The device 110 heats the loaded semiconductor wafer 201 by the wafer heater 113 to a bump bonding temperature which is approximately 150° C. in the embodiment. A semiconductor wafer after bumps are formed by the bump forming head 190 to electrodes of ICs on the semiconductor wafer 201 will be denoted as a bump-formed wafer 202.

The wafer turning member 111 has a metallic disc wafer stage 1111 of a larger diameter than a diameter of the semiconductor wafer 201 for loading the semiconductor wafer 201 thereon, and a metallic disc turntable 1112 of a nearly equal size as a size of the wafer stage 1111 having threads 11127 formed to the entire circumference to be meshed with a gear 1122 to be described later of the turning device 112.

The turning device 112 is a device for turning the wafer turning member 111 with the semiconductor wafer 201 loaded thereon in a circumferential direction of the semiconductor wafer 201. In the present embodiment, the turning device 112 has a driving source 1121 of a servo motor which is controlled by the control device 180 to drive, the gear 1122 to be meshed with the threads 11127 of the turntable 1112, and a rotational force transmission mechanism 1123 for transmitting a driving force generated by the driving source 1121 to the gear 1122 thereby rotating the gear 1122 while preventing heat of the turntable 1112 from being conducted to the driving source 1121. Although a timing belt is used as the rotational force transmission mechanism 1123 in the embodiment, the transmission mechanism is not limited to this structure.

As described hereinabove, since the semiconductor wafer 201 is turned via the driving source 1121, the rotational force transmission mechanism 1123, the gear 1122, threads 11127 of the turntable 1122, and the wafer stage 1111, a turning angle of the semiconductor wafer is controlled by the control device 180, enabling the semiconductor wafer 201 to be turned at any angle.

The recognition camera 150 with an image pickup camera 151 detects a position of the IC and an inclination with respect to a reference line of the IC on the basis of image pickup information of the image pickup camera 151. The image pickup camera 151 which is freely movable in row and column directions above the semiconductor wafer 201 picks up images of marks 224, 2232–2234 for detection on the semiconductor wafer. The recognition device 150 is connected to the control device 180. The control device 180 controls to drive the turning device 112 on the basis of the detected inclination information thereby controlling a quantity of the turn of the wafer turning member 111.

The bump forming head 190 is a device for forming bumps onto the electrodes of the ICs on the semiconductor wafer 201 loaded on the wafer turning member 111 of the heating device 110 and heated to the bump bonding temperature. The bump forming head 190 includes, in addition to a wire supply part 191 for supplying a gold wire to be a material for each bump, a bump formation part for melting the gold wire to form a melted ball and pressing the melted ball to the electrode, an ultrasonic wave generation part for applying ultrasonic waves to the bump at the pressing time, etc. The thus-constituted bump forming head 190 is attached on an X, Y table 192 which has, e.g., a ball screw structure and is movable in mutually orthogonal X and Y directions on a plane. The bump forming head 190 is moved in the X, Y directions by the X, Y table 192 to be able to form bumps to electrodes of each IC of the fixed semiconductor wafer 201.

The carriers 130 are devices for taking out the semiconductor wafer 201 from a first storage container in which the semiconductor wafer 201 is stored, and for transferring to store the bump-formed wafer 202 at a second storage container to store the bump-formed wafer 202.

One of the transfer devices 140 receives the semiconductor wafer 201 from the carrier 130, then transfers the wafer 201 to the preheating device 160 and, moreover, transfers the wafer 201 from the preheating device 160 to the heating device 110 for bump bonding. The other transfer device 140 transfers the bump-formed wafer 202 on the wafer stage 1111 to the postheating device 170 and delivers the wafer 202 from the postheating device 170 to the carrier 130.

The preheating device 160 is a device for raising a temperature of the semiconductor wafer 201 loaded thereon from a room temperature to the bump bonding temperature at which bumps are formed by the heating device 110.

The postheating device 170 is a device for gradually decreasing a temperature of the bump-formed wafer 202 loaded thereon from the bump bonding temperature to the vicinity of the room temperature.

The control device 180 controls to drive each part constituting the bump forming apparatus 101 of the above constitution, thereby controlling the bump formation method including the aforementioned first-third points to be described in detail below.

The bump formation method carried out by the above-constituted bump forming apparatus 101 will be depicted hereinbelow. The bump formation method is executed by driving control performed by the control device 180. Processing and transfer operations of the semiconductor wafer 201 from the first storage container to the heating device 110, and processing and transfer operations of the bump-formed wafer 202 from the heating device 110 to the second storage container after bumps are formed to the semiconductor wafer 201 are omitted from the following description. The operation up to the end of the bump formation after the semiconductor wafer 201 is loaded to the wafer stage 1111 of the heating device 110 will be detailed below.

Figure 2:
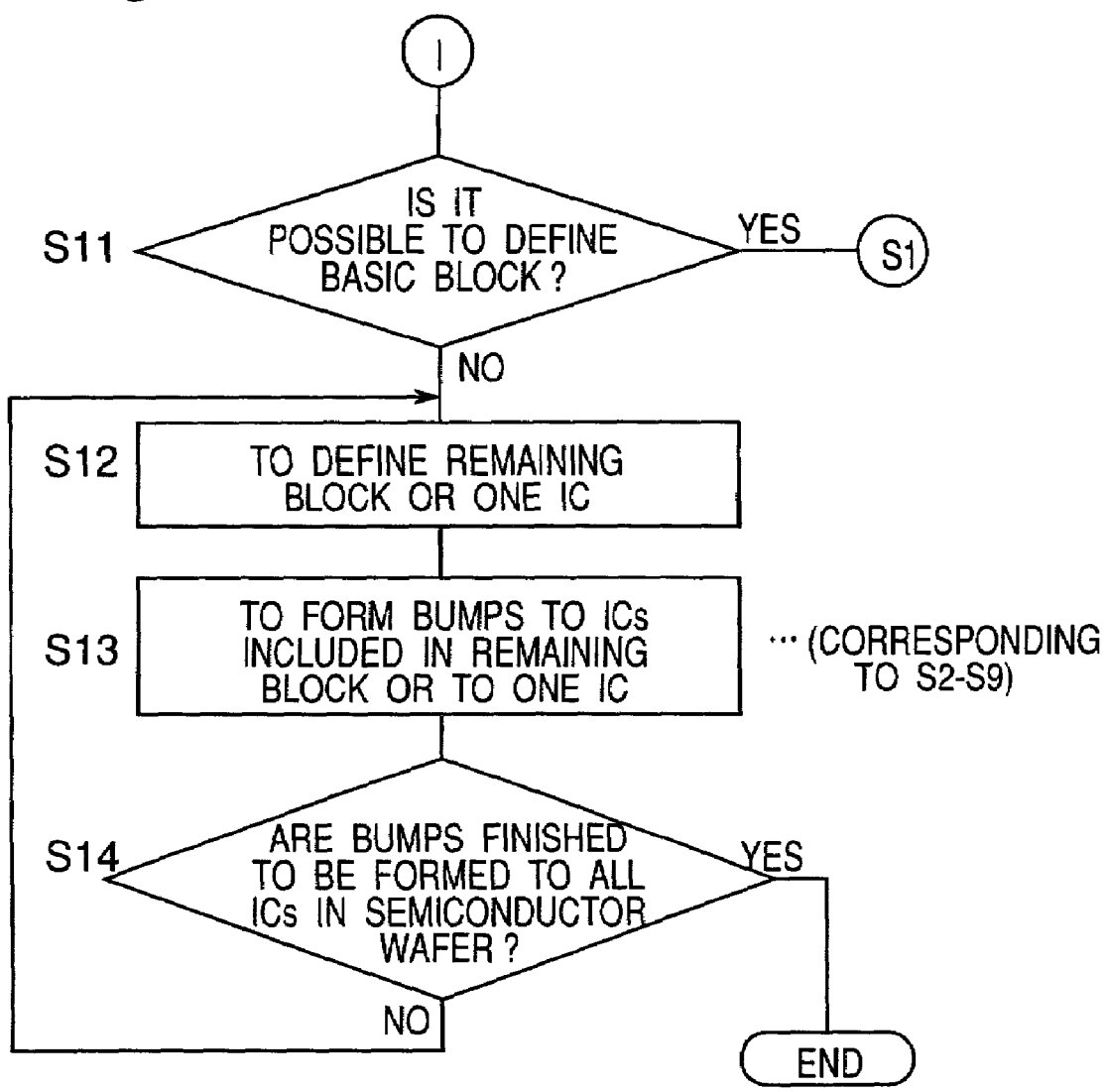
FIG. 2 is a flow chart showing operations of the bump formation method in the preferred embodiment of the present invention.

The bump formation method is briefly indicated in FIGS. 1–3, which will be discussed along each step (designated by "S" in the drawings).

An allowable range of a positional deviation of the bumps to the electrodes when bumps are formed to the electrodes of the IC is conventionally ±5 μm. The value of the allowable range is determined while the thermal expansion or the like of the image pickup camera 151 and the bump forming head 190 because of the heat heating the semiconductor wafer 201 for bump formation is taken into account. The above-indicated allowable range of ±5 μm is a range which can be satisfied even when bumps are formed onto electrodes on a single IC in a size of 5–6 mm square. Therefore, with respect to a single IC in a size of 0.5 mm or 0.35 mm square in these days, the allowable range can be fulfilled even if bumps are continuously formed to, e.g, approximately 10 of the ICs without executing position recognition.

Therefore, according to the present embodiment, in step 1, a basic block is defined imaginarily having a plurality of ICs adjacent each other in a row or column direction, or in row and column directions among ICs arranged in a grid pattern on the semiconductor wafer 201 to be subjected to bump bonding. Position recognition is executed with respect to the basic block. Then bumps are continuously formed to all ICs included in the basic block. So, the bump forming operation is carried out on every basic block. When the bump formation is moved from one basic block to another basic block among the basic blocks, the position recognition is executed with respect to another (a second) basic block to form bumps to the ICs included in the second basic block.

By adopting this method, the number of times the IC position recognition is performed can be reduced in comparison with the conventional art in which the recognition operation is carried out for every IC. Thus, the productivity in forming bumps to the semiconductor wafer can be improved as compared with the conventional art.

The number of ICs for defining the above basic block is a value that, when the bumps are continuously formed onto the electrodes of all ICs in the basic block, all of the positional deviations between the electrodes and bumps thereon are kept within the allowable range. Conversely, a single basic block is defined by such number of ICs.

The number of rows, columns of ICs for forming the basic block is preliminarily stored to a memory part 181 in the control device 180.

Figure 4:
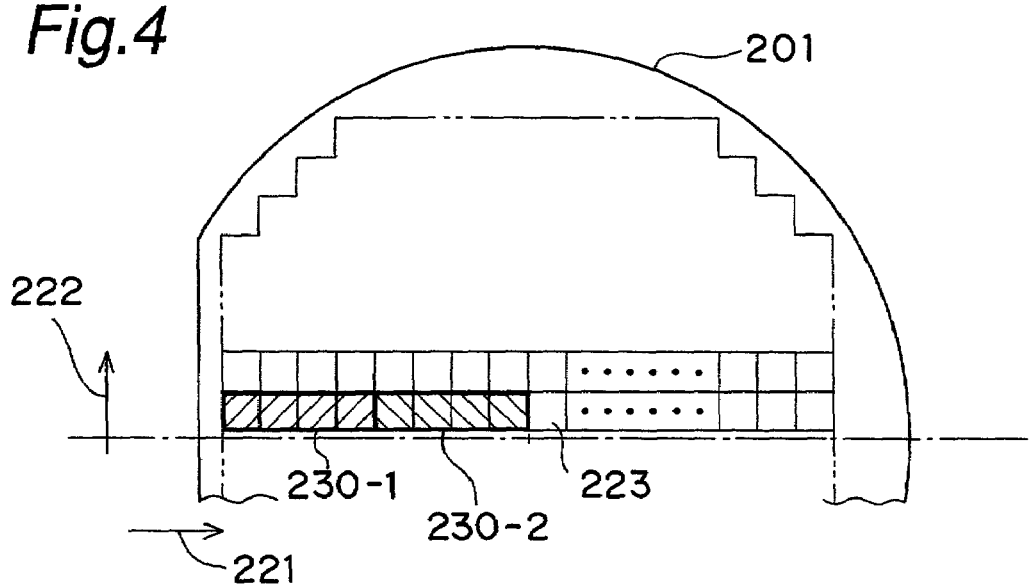
FIG. 4 is a diagram for explaining a basic block formed in the bump formation operation of FIGS. 1 and 2.
Figure 5:
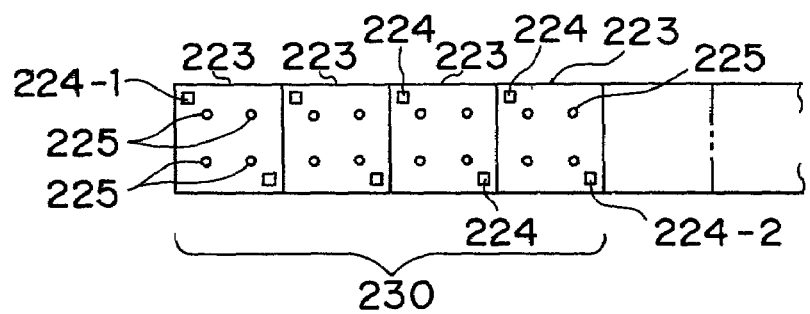
FIG. 5 is an enlarged view of one basic block in FIG. 4.

The operation of forming the basic block will be described below with reference to the drawings. As shown in FIG. 4, the semiconductor wafer 201 loaded on the wafer stage 1111 and sucked to the wafer stage 1111 in the embodiment has a plurality of ICs 223 arranged in the grid pattern along a row direction 221 and a column direction 222. The control device 180 forms basic blocks 230 starting from the IC 223 where the bump formation is to be started in accordance with the stored number of rows and columns of ICs for defining the basic block. For example as shown in FIG. 5, the control device 180 forms basic blocks 230-1, 230-2, . . . , of, e.g., one row and four columns from, e.g., a circumferential edge portion of a central part of the semiconductor wafer 201.

Figure 6:
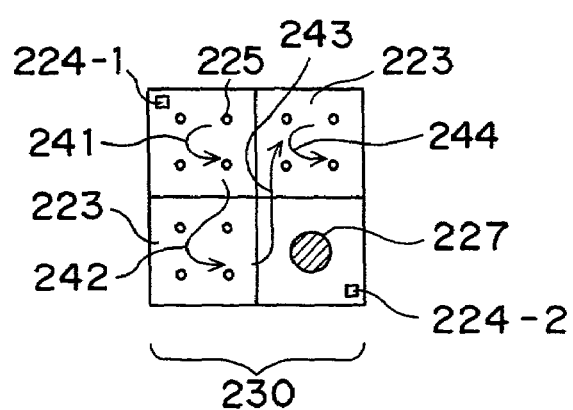
FIG. 6 is a diagram showing a different form of the basic block of FIG. 4 and a form of a bad mark.

The position where the bump formation is to be started is not restricted to the aforementioned position. Also the number of rows and columns of ICs for defining the basic block is not limited to the above, and the basic block may be defined, for instance, of a plurality of rows and a plurality of columns as shown in FIG. 6 or may be defined of a plurality of rows and one column.

The number of rows and columns of ICs in the basic block 230 is not limited to a constant value and can be changed. For example, while the ultrasonic wave generation part of the bump forming head 190 is partly positioned above the wafer stage 1111 at the circumferential edge portion of the semiconductor wafer 201, the other part is positioned off of the wafer stage 1111 and consequently the thermal effect of the ultrasonic wave generation part becomes uneven in some cases because the wafer stage 1111 is heated to form bumps as described earlier. As such, for a position, e.g., the circumferential edge portion of the semiconductor wafer 201 where the thermal effect is not even to, e.g., a horn part 193 of the ultrasonic wave generation part of the bump forming head 190 as shown in FIG. 7, the basic block can be defined by one row and two columns like basic blocks 231-1, 231-2. On the other hand, for a position, e.g., the central portion of the semiconductor wafer 201 where the thermal effect is relatively even, the basic block can be defined by one row and four columns as in basic blocks 230-1, 230-2.

As indicated in FIG. 8, in the case where the bump formation is started from, e.g., an IC 223-1, basic blocks 230 may not be formed while a lapse of time from the start of bump formation is short, and basic blocks 230 are formed as the passed time is longer. That is, the number of rows and columns of ICs may be increased to a certain constant value such as, e.g., in a basic block 230-4 of one row and two columns, a basic block 230-5 of one row and three columns.

Figure 9:
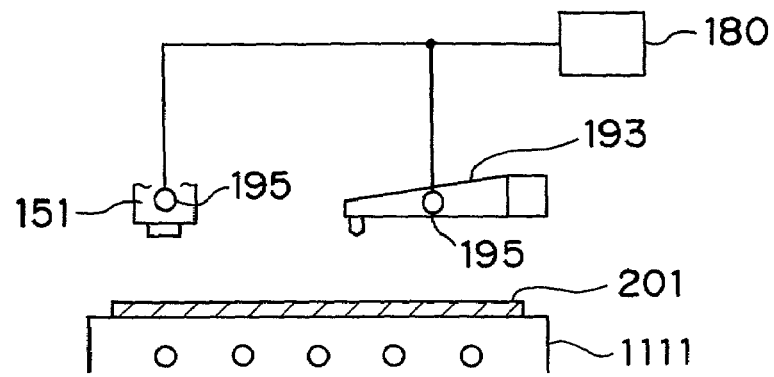
FIG. 9 is a diagram of a state in which a sensor for measuring a temperature above the semiconductor wafer or the like is installed to a horn part and an image pickup camera so as to change the number of ICs for defining the basic block.

A temperature sensor of, e.g., a thermocouple or strain sensor 195 may be attached to at least either the horn part 193 of the bump forming head 190 or the image pickup camera 151 as shown in FIG. 9, so that the control device 180 may determine the number of rows and columns of ICs in the basic block 230 on the basis of output information of the sensor 195.

Alternatively, the number of rows and columns of ICs of the basic block 230 may be determined by a position of the ICs 223 on the semiconductor wafer 201 where bumps are to be formed, or the number of rows and columns of ICs may be forcibly determined or changed.

Defining the basic block 230 in the control device 180 is carried out in a manner as follows in the embodiment. As similar to the conventional art, the control device 180 has a program for bump formation stored in the memory part 181 for each of all ICs 223 formed to the semiconductor wafer 201. Position information of every two marks 224 for position recognition present in each IC 223 indicating an arrangement position of the IC 223, position information of each electrode 225 present in each IC 223, and information on a bump formation order to the electrodes 225 present in one IC 223, etc. are described in the program. The control device 180, while utilizing the program for bump formation, executes the bump formation operation while taking a region of the above-determined number of rows and columns of ICs as the basic block 230.

In other words, with respect to one unit defining one basic block 230, forming a fresh program which represents position information of the basic block, position information of electrodes in the basic block, and the like is not executed. The existing program for bump formation is utilized to form bumps. The need of correcting or reforming the program is accordingly eliminated even if the number of rows and columns of ICs of the basic block 230 is changed, thereby facilitating adaptation with a high degree of freedom.

After the control device 180 determines the basic blocks 230 as above, in step 2, position recognition is carried out for the basic block 230 including ICs 223 to which bumps are to be formed. Each of the ICs 223 constituting the basic block 230 has two marks 224 for position recognition as mentioned above. In the embodiment, first, one of two marks 224 for position recognition corresponding to diagonal positions of the basic block 230 among marks 224 of the ICs 223 present at both ends of the basic block 230 is imaged by the image pickup camera 151 of the recognition device 150. For instance, in the basic block 230 shown in FIG. 5, a first mark 224-1 for position recognition of two marks 224-1 and 224-2 for position recognition corresponding to the diagonal positions is imaged.

In next step 3, it is determined whether or not information for position correction of the ICs 223 is already obtained, and an inclination of the ICs 223 is already corrected when the semiconductor wafer 201 is placed on the wafer stage 1111. Although the operation of obtaining the information for position correction for the ICs 223 and correcting the inclination of the ICs 223 which are determined in step 3 will be described in detail later, in the case where the ICs 223 are already corrected particularly in inclination, operation in next step 4 can be eliminated. Accordingly, the number of times the recognition operation is performed is reduced and the productivity is improved. On the other hand, if the inclination is not corrected yet, the process moves to next step 4.

In step 4, the image pickup camera 151 of the recognition device 150 images the remaining second mark 224-2 for position recognition of the two position recognition marks 224-1 and 224-2. Based on the position information of the two position recognition marks 224-1 and 224-2, the control device 180 obtains a position and an inclination of the basic block 230 according to a known arithmetic method.

In the present embodiment, position recognition marks 224-1 and 224-2 present at both ends of the basic block 230 are employed in steps 2 and 4. Although using the position recognition marks 224 present at diagonal positions is preferred particularly from a viewpoint of obtaining the inclination information of the basic block 230, the position recognition mark 224 to be used is not limited to the position recognition marks 224-1 and 224-2 present at both ends of the basic block 230.

In succeeding step 5, on the basis of the above inclination information of the basic block 230 which is obtained in step 2 or in steps 2 and 4, the control device 180 controls to drive the turning device 112 of the heating device 110 to turn the wafer stage 1111 so that the IC 223 becomes parallel to a reference line, e.g., the X direction or Y direction. At this time, the wafer stage 1111 can be turned by any angle because the present embodiment adopts the constitution including the wafer turning member 111 and the turning device 112 as described before.

The control device 180 controls the amount of the move of the X, Y table 192 of the bump forming head 190 based on the above position information of the basic block 230 when bumps are to be formed.

Figure 10:
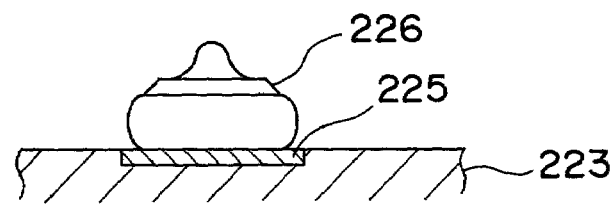
FIG. 10 is a diagram showing a state in which a bump is formed on an electrode.

In following step 6, the control device 180 controls to drive the bump forming head 190 based on the program for bump formation with respect to the semiconductor wafer 201 loaded and sucked onto the wafer stage 1111 and also heated to the bonding temperature. Thus, bumps 226 as shown in FIG. 10 are formed onto each of electrodes 225 of the ICs 223 included in the basic block 230.

Bumps are continuously formed in the bump formation operation without carrying out position recognition of IC 223 to all ICs 223 included in one basic block 230. Without the position recognition operation executed for each of the ICs 223 according to the embodiment, the number of times the position recognition process is performed is reduced in comparison with the conventional art, thus enabling the productivity to be improved.

Step 7 is carried out together with the bump formation after the bumps 226 are started to be formed.

Figure 11:
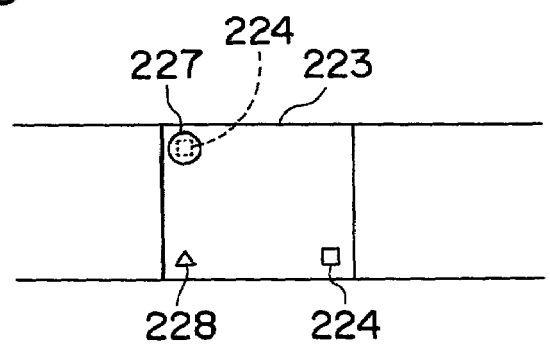
FIG. 11 is a diagram for explaining a mark for position correction which is applied to the IC.

In the aforementioned step 7, it is determined whether or not a bad mark applied to the ICs 223 included in the basic block 230 to which the bump formation is being formed is to be detected. The bad mark is applied, e.g., at an inspection after a wiring pattern recognition process before the bumps are formed onto the electrodes 225, which is a mark for indicating a defective IC not functioning as an IC. The bad mark is applied to a nearly central part of the IC 223 as shown by a numeral 227 in FIG. 6 or applied over-lapping with one of the two position recognition marks 224 of the IC 223 as shown in FIG. 11. The bad mark is formed to any position within the IC 223. In the case where the bad mark 227 is formed overlap-ping with the position recognition mark 224, it becomes impossible to recognize the position recognition mark 224 having the bad mark 227. Therefore, due to the nonrecognition, it can be determined that the IC 223 or basic block 230 is a defective IC or defective block if the position recognition mark 224 cannot be recognized However, bad marks 227 might be included in other ICs 223 in the basic block 230 in some cases even when the bad mark 227 is not detected at the position recognition mark 224 of the basic block 230. Therefore, the detection for the bad mark 227 is preferably carried out for other ICs 223 as well.

The presence/absence of the bad mark is detected by imaging the ICs 223 by the image pickup camera 151 in the embodiment.

In the case where the bad mark 227 is applied to one of two position recognition marks 224-1 and 224-2 to be recognized in the basic block 230 and when the bad mark is actually detected, the position recognition with respect to other basic blocks 230 may be started without forming bumps to the subject basic block 230. However, some of the ICs 223 constituting the basic block 230 which is detected to include the bad mark 227 may be good ICs. In order not to waste good ICs, even if one of the position recognition marks 224-1 and 224-2 imaged for the position recognition of the basic block 230 has the bad mark 227, it is preferable to make a determination for each of the ICs 223 included in the basic block 230 whether or not the bad mark 227 is applied thereto, as shown in steps 811–813 in FIG. 13.

Figure 13:
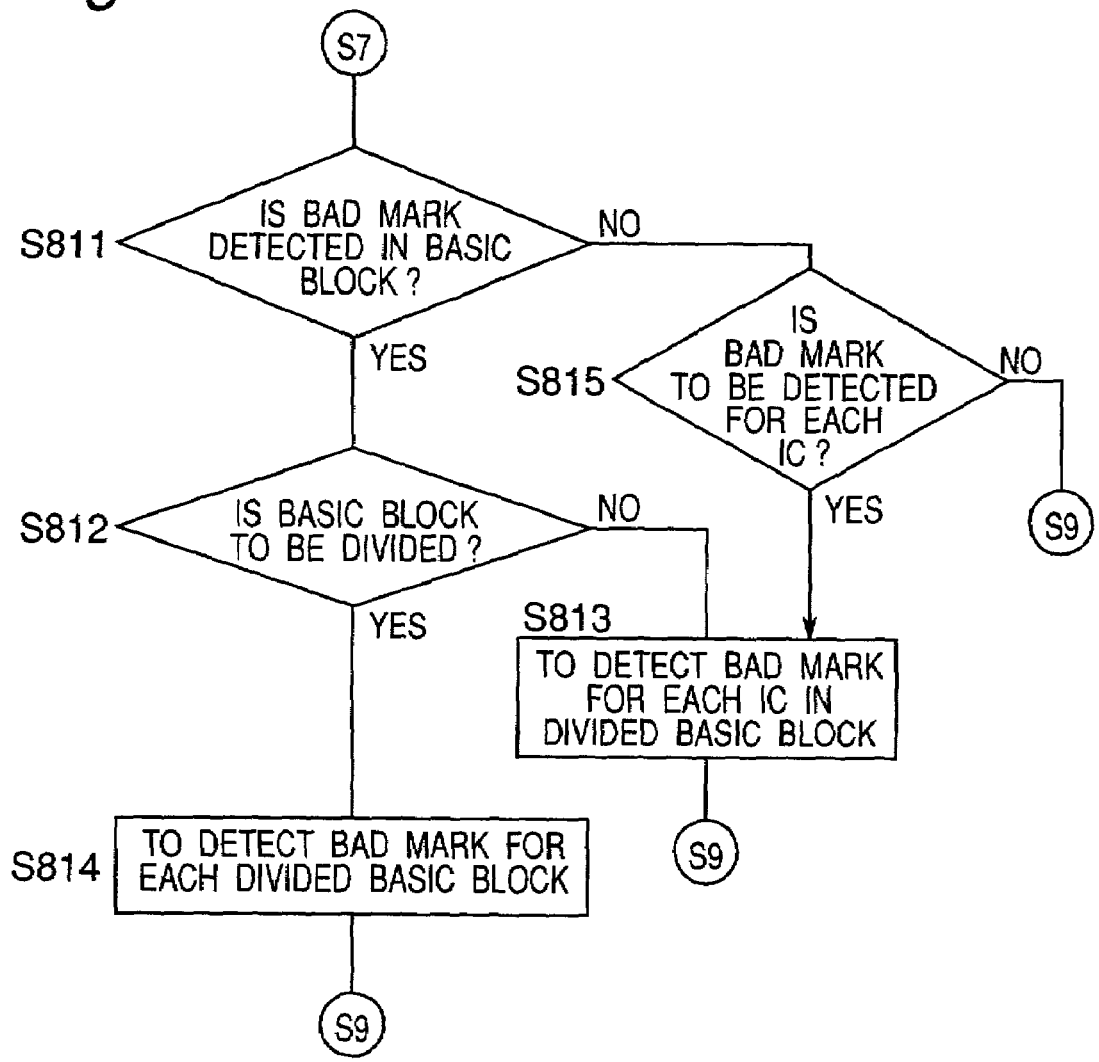
FIG. 13 is a flow chart for explaining the detailed operation of the bad mark detection shown in FIG. 1.

If the basic block 230 is defined by, e.g., six ICs 223 of one row and six columns and the basic block 230 is detected through the position recognition to include the bad mark 227, it may be so arranged as shown in step 814 of FIG. 13 that the presence/absence of the bad mark 227 is recognized for each of divided basic blocks which are obtained by more finely dividing the subject basic block 230 instead of immediately determining the presence/absence of the bad mark 227 for each IC 223 in the basic block as described above. If the bad mark 227 is detected in the divided basic block, the presence/absence of the bad mark 227 is recognized for a next divided basic block or next basic block. The operation of step 814 is effective when two position recognition marks 224 are to be recognized for the basic block 230.

Alternatively, the IC 223 detected to include the bad mark 227 may be separated from the basic block 230 so as not to form bumps to the subject IC 223 with the bad mark, and the position recognition of the subject basic block 230 may be executed with a next, e.g., adjoining IC 223.

The following description of the bad mark detection operation exemplifies the case of determining the presence/absence of the bad mark 227 for every one of all ICs 223 in the basic block 230.

When the bad mark is to be detected, the step moves to next step 8, where the bad mark is detected. The control device 180 stops forming bumps to the IC 223 determined to have the bad mark and moves to detect the bad mark for the next IC 223. The time required for forming bumps to the IC 223 which is useless to the IC 223 with the bad mark can be cut by this operation and the productivity can be improved.

On the other hand, when the bad mark is not to be detected, the step goes to step 9 while bumps are formed to all ICs 223 included in the basic block 230.

When the inclination correction to the semiconductor wafer 201 is already executed as determined in the above-described step 3 and when the bad mark 227 is formed overlapping with one position recognition mark 224, an operation to be described below may be carried out in step 8 with reference to FIG. 12. It becomes impossible to recognize the position recognition mark 224 when the bad mark 227 is formed overlapping with one of the position recognition marks 224, and eventually it becomes impossible to recognize the position of the IC 223 or basic block 230. To avoid this, with respect to each IC 223, it is necessary to treat, in addition to the position recognition mark 224, an arbitrary point in a circuit pattern on the IC 223 as a mark 228 for position correction to substitute for the position recognition mark 224 as shown in FIG. 11. The mark 228 for position correction is illustrated to be triangular in FIG. 11 for the sake of convenience. Although the mark 228 for position correction may be formed separately to the IC 223, it is simpler and preferable to register the arbitrary point in the circuit pattern of the IC 223 as above into a program as the position correction mark 228.

Figure 12:
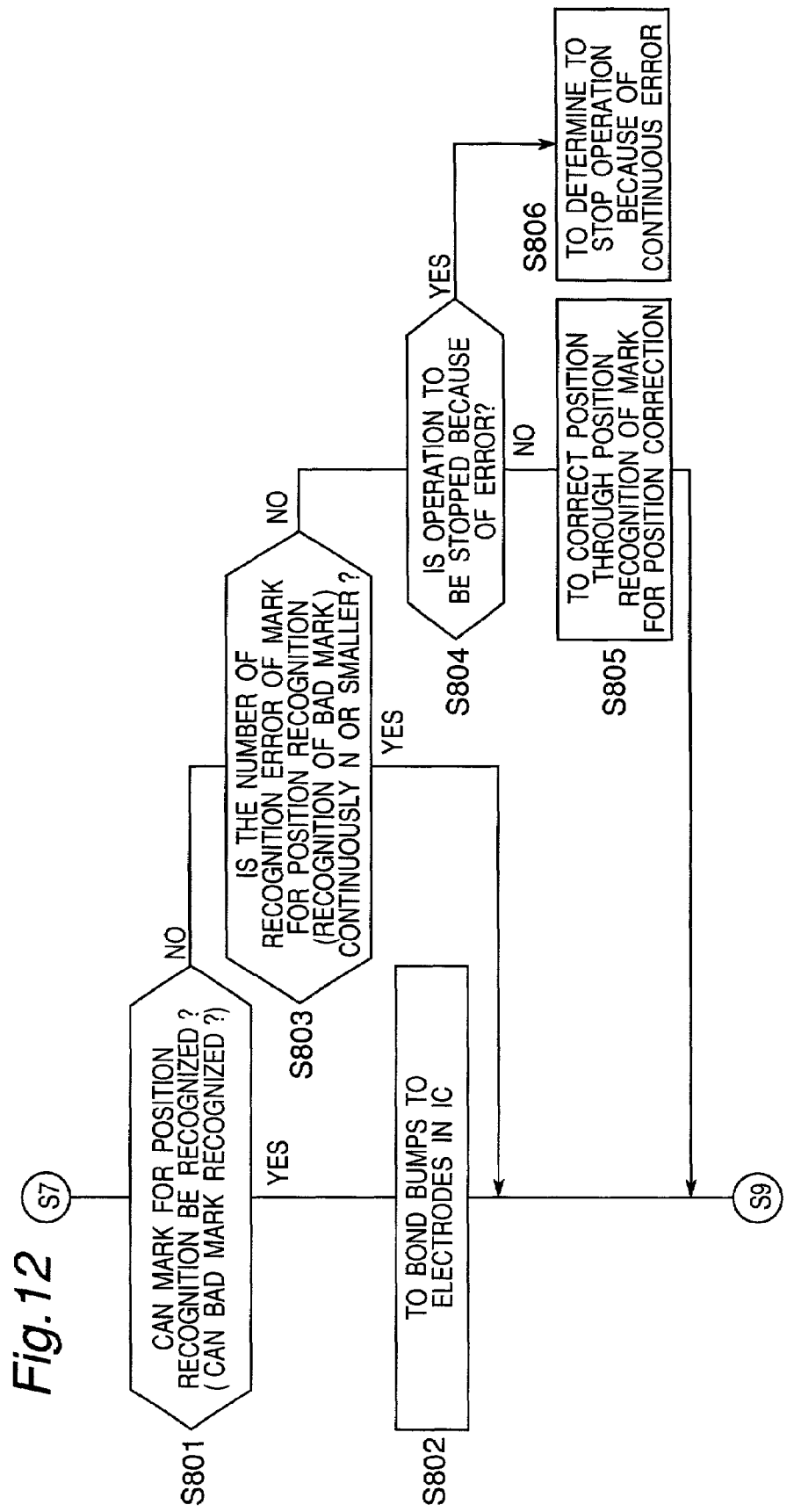
FIG. 12 is a flow chart for explaining the detailed operation of the bad mark detection shown in FIG. 1.

Regarding FIG. 12 showing the operation of step 8 in detail, in step 801, the control device 180 controls to drive the recognition device 150 to recognize one position recognition mark 224 of the IC 223 included in the basic block 230 as described earlier. When the position recognition mark 224 can be recognized (in other words, when the IC 223 includes no bad mark), the step goes to step 802, in which the control device 180 controls to drive the bump forming head 190 to form bumps 226 to electrodes 225 of the IC 223.

When the position recognition mark 224 cannot be recognized in step 801 (that is, when the IC 223 has a bad mark), the step moves to step 803 and the control device 180 determines whether or not the number of counts that the position recognition mark 224 cannot be recognized is n or less. In other words, how many defective ICs are continuously detected is determined.

In some cases, the position of a good IC cannot be determined even if the good IC is detected after many defective ICs are detected, or the quantity of the positional deviation between the electrode and the bump exceeds the allowable range even when the bumps are formed to the electrodes of the good IC. Therefore, the above number n is the number of ICs 223 in which at least the quantity of the positional deviation between the electrode 225 and the bump 226 of the IC 223 is accommodated within the allowable range. The number n is set to the control device 180 in advance.

When the number of counts indicating that the position recognition mark 224 cannot be recognized is not larger than the n in step 803, the step shifts to step 9. On the other hand, when the number of counts exceeds the above n, it is highly possible that the quantity of the positional deviation between the electrode 225 and the bump 226 of the IC 223 exceeds the allowable range as mentioned above. Then it is determined in step 804 whether or not the operation is to be stopped because of an error, and the operation is stopped in step 806 if it is so determined. Oppositely, if the operation is not to be stopped, the step goes to step 805 and the control device 180 controls to operate the recognition device 150 thereby recognizing the position correction mark 228 and confirming the present position to correct the position. The step then moves to step 9.

Although it is so adapted in the embodiment as to actually detect the presence/absence of the bad mark 227 in steps 8, 801–806, and 811–814, the bump formation may be executed on the basis of, e.g., position data of defective ICs in the already processed semiconductor wafer. In this case, since position data of the defective ICs is hardly equal in all semiconductor wafers 201, it is preferable to detect the position of the bad mark 227 again and update the position information of the bad mark 227 for every constant number of wafers. The above constant number can be appropriately set by a manufacturer of the semiconductor wafer 201, a production lot of the semiconductor wafer, etc.

Even when the bad mark 227 is not to be detected in step 811, step 815 may be provided to determine whether or not the bad mark 227 is to be detected for each of ICs 223 in the basic block 230. The step goes to step 9 when the detection is not to be carried out, whereas the step goes to step 813 when the detection is to be carried out.

In next step 9, it is determined whether or not bumps are already formed to all ICs 223 included in the basic block 230 subjected to the bump formation. The process returns to step 6 if an IC 223 without the bumps formed is present. The process advances to step 10 when bumps 226 are formed to all ICs 223 in the basic block 230.

An example of the bump formation order to all ICs 223 included in the basic block 230 is indicated in FIG. 6. The basic block 230 is defined by an arrangement of ICs 223 of two rows and two columns in FIG. 6. Bumps 226 are formed to each of electrodes 225 in the order designated by arrows 241–244. As above, the bump formation order is preferably such that the bump formation is completed for every IC 223 included in the basic block 230 to make almost uniform a bump formation state in one IC.

It is determined in step 10 whether or not bumps 226 are formed to all ICs 223 in the semiconductor wafer 201. The aforementioned "all" ICs 223 mean "all good" ICs in the case of not forming bumps to defective ICs as referred to above.

The bump formation process to the semiconductor wafer 201 is terminated when bumps are formed to all ICs 223. On the other hand, the process goes to the next step 11 if there are ICs 223 without bumps formed yet.

Figure 14:
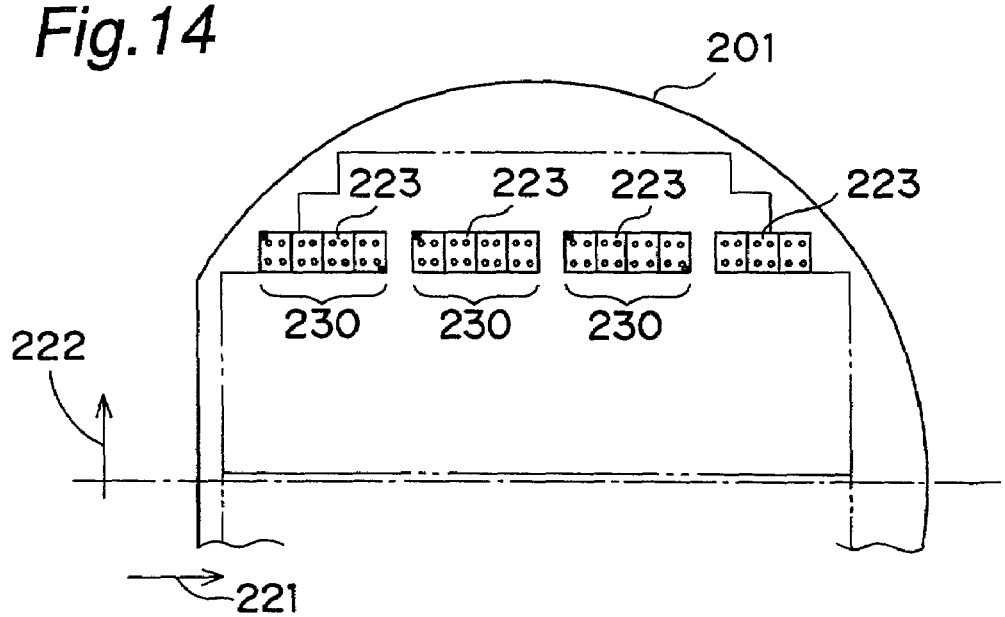
FIG. 14 is a diagram for explaining the remaining ICs except the basic blocks.

The process related to the bump formation is completed on one basic block 230 through the operations up to the above step 9. It is determined in step 11 whether or not further basic blocks 230 can be formed of the ICs 223 in the semiconductor wafer 201. Specifically, if a certain row in the semiconductor wafer 201 includes, e.g., 15 ICs 223 as shown in FIG. 14, then three basic blocks 230, each of one row and four columns, can be formed and three ICs 223 are left in the row. The remaining three ICs 223 cannot form the basic block 230 of one row and four columns. That is, the basic block cannot always be defined by the set number of rows and columns of ICs.

When the basic block 230 can be formed of the set number of rows and columns of ICs, step 11 returns to step 1 to carry out the process related to the bump formation as above to the defined basic blocks 230. However, if there are ICs 223 of the number not satisfying the set number of rows and columns and consequently the basic block 230 cannot be formed, step 11 is followed by the next step 12. In the semiconductor wafer 201, a bonding boundary representing a region where bumps 226 can be formed is arranged along circumferential edge parts of the ICs 223 for the formed ICs 223 on the wafer 201. The above number not satisfying the set number of rows and columns is a number which is obtained with respect to the ICs 223 included within the region delimited by the bonding boundary. ICs of the number not satisfying the number of rows and columns for constituting the basic block 230 in a certain row or column, or in certain row and column will be denoted as remaining ICs.

Figure 15:
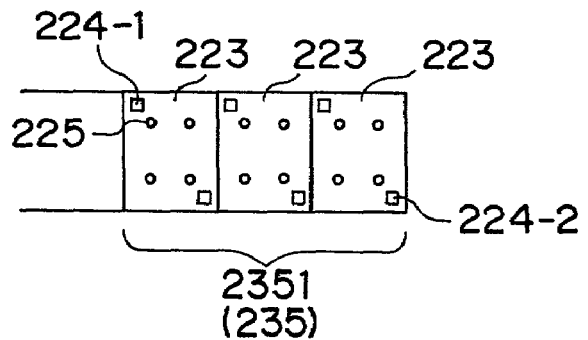
FIG. 15 is a diagram of the case in which a block for a remainder is defined by the remaining ICs of FIG. 14.
Figure 16:
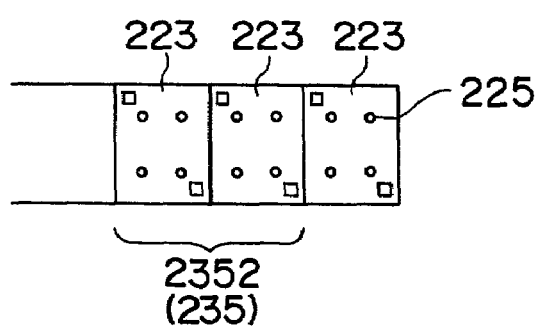
FIG. 16 is a diagram of the case in which blocks for a remainder are defined by the remaining ICs of FIG. 14.

The control device 180 determines in step 12 whether to carry out the process related to the bump formation by forming the ICs 223 of the number not satisfying the set number of rows and columns into blocks, to execute the process related to the bump formation for every one of the ICs 223, or to execute the process related to the bump formation by a combination of the above. Specifically with reference to the above example, with respect to the remaining ICs 223, one block 2351 for the remainder is formed with all of the remaining ICs 223 (namely, with the above three ICs 223 in this example as shown in FIG. 15), and then the process related to the bump formation is carried out to the block 2351 for the remainder. Alternatively, one block 2352 for the remainder is formed with two ICs 223 as shown in FIG. 16 and then the process related to the bump formation is carried out to the block 2352, or the process related to the bump formation is carried out individually to each of the remaining ICs 223.

Whether to define the block 235 for the remainder with respect to the remaining ICs 223, or to process the remaining ICs 223 one by one is preliminarily programmed in the control device 180. In the case of defining the block 235 for the remainder, the number of rows and columns of ICs 223 for defining the block 235 for the remainder with respect to the remaining ICs 223 may be automatically determined by the control device 180 or may be set beforehand.

In next step 13, the process related to the bump formation which corresponds to operations of the above steps 2–9 is executed either with respect to the block 235 for the remainder or each of the remaining ICs 223, or with respect to the block 235 for the remainder and each of the remaining ICs 223, which are constituted in step 12.

It is determined in the next step 14 whether or not bumps 226 are completely formed to all ICs 223 in the semiconductor wafer 201. If there are ICs 223 having bumps not formed, the step returns to the foregoing step 12. On the contrary, when all ICs 223 have bumps 226 completely formed thereto, the bump formation operation to the semiconductor wafer 201 is finished. The semiconductor wafer 201 with the bumps 226 formed is transferred and stored as the bump-formed wafer 202 by the transfer device 140 and the carrier 130 into the second storage container.

The operation of obtaining information for position correction of the ICs 223 formed on the semiconductor wafer 201 and of correcting the inclination of the ICs 223 (referred to as a "wafer mark recognition operation" hereinafter) which is determined as to whether to be already executed or not in the above-discussed step 3 will now be described with reference to FIG. 3 and the like. The wafer mark recognition operation alike is controlled by the control device 180.

In a process prior to forming bumps with the wafer 201 divided into blocks, if the wafer mark recognition operation is executed when the semiconductor wafer 201 is placed on the wafer stage 1111, the recognition operation for two position recognition marks 224-1 and 224-2 carried out in steps 2 and 4 can be reduced to the recognition for either mark, so that the productivity is improved furthermore.

This will be more specifically described. A position of the IC formation pattern on the semiconductor wafer with respect to an outline of the semiconductor wafer 201 and an inclination of an arrangement in the row and column directions of ICs 223 forming the IC formation pattern with respect to the reference lines corresponding to the X and Y directions (i.e., the inclination of the ICs) are uniform within the same production lot of the semiconductor wafers 201. However, a positional difference and an inclination difference are actually present between two different production lots. As a result, bumps 226 may be positionally deviated to the electrodes 225 if the bump formation is always started from an equal position to the semiconductor wafers 201 of all production lots.

In order to prevent this, the position of the IC formation pattern with respect to the outline of the semiconductor wafer 201 and the inclination of ICs to the reference lines are confirmed when the semiconductor wafer 201 is placed on the wafer stage 1111, thereby eliminating the positional deviation of the bumps 226 to the electrodes 225.

Particularly in the bump forming apparatus 101 of the present embodiment, as described above, the semiconductor wafer 201 is turned with the use of the wafer turning member 111 and the turning device 112 arranged at the heating device 110 via the driving source 1121, the rotational force transmission mechanism 1123, the gear 1122, the threads 11127 of the turntable 1112 and the wafer stage 1111, with the turning angle being controlled by the control device 180, so that the semiconductor wafer 201 can be turned at any angle. In consequence, the wafer stage 1111 having the semiconductor wafer 201 loaded thereon can be highly accurately and easily turned on the basis of an angle of the inclination of the ICs obtained by the wafer mark recognition operation. The angle of the inclination of the ICs can be highly accurately and easily corrected accordingly.

Since the need of obtaining the angle of the inclination of the ICs through the recognition operation from two position recognition marks 224-1 and 224-2 at the bump formation time is eliminated by correcting the angle of the inclination of the ICs beforehand, it is enough to obtain only position information of the IC formation pattern by the recognition operation of either one of the position recognition marks 224-1 and 224-2. The number of times the recognition operation is performed can hence be further reduced and the productivity can be improved.

The above wafer mark recognition operation will be described in detail below.

Figure 3:
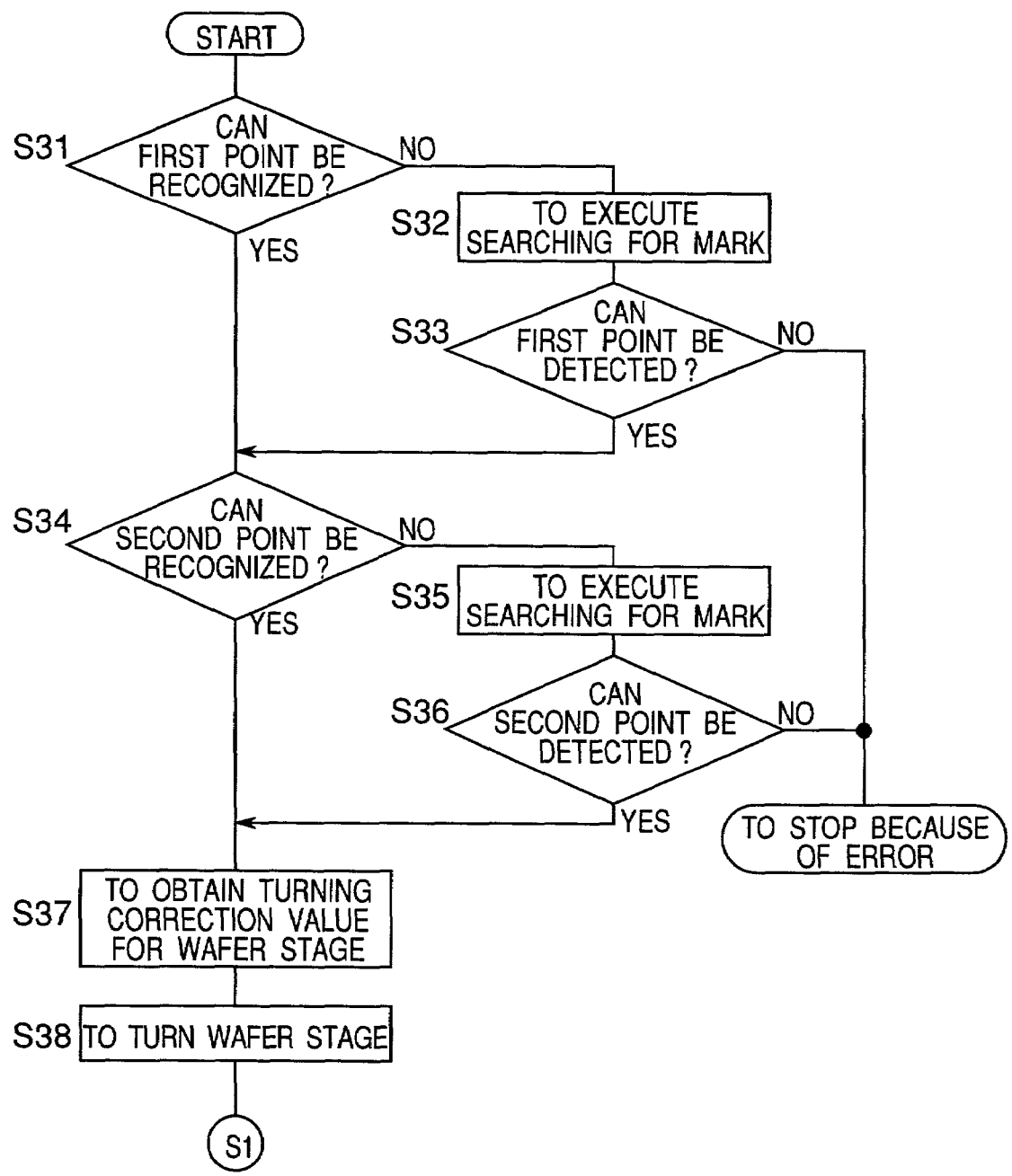
FIG. 3 is a flow chart showing an operation of detecting a position and an inclination of ICs of a semiconductor wafer which can be carried out before the bump formation operation in FIGS. 1 and 2.
Figure 17:
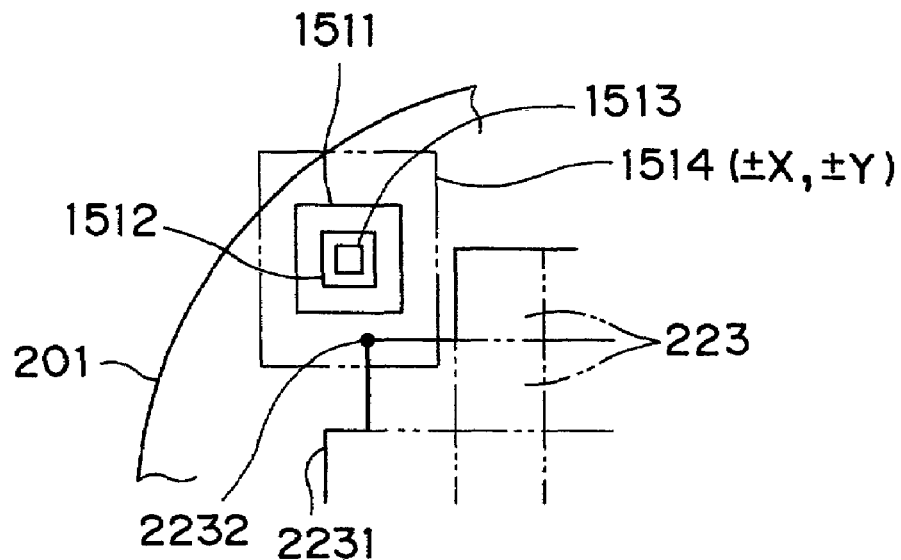
FIG. 17 is a diagram showing a view field, a maximum deviation area, etc. of the image pickup camera for explaining the search operation carried out in step 32 in FIG. 3.

In step 31 shown in FIG. 3, it is determined whether or not a first point among characteristic points on the semiconductor wafer 201 loaded on the wafer stage 1111 is recognized by the image pickup camera 151 of the recognition device 150. In other words, it is necessary for executing the above wafer mark recognition operation to recognize by the image pickup camera 151 two arbitrary detection points for recognition which correspond to marks for detection on the semiconductor wafer 201. A first detection point for recognition among the above two detection points for recognition is set in the control device 180 beforehand. As shown in FIG. 17, according to the embodiment, a corner part in an outline 2231 of the IC formation pattern formed at the circumferential edge part of the semiconductor wafer 201 to which ICs 223 are formed by a stepper is set as the first detection point 2232 for recognition.

The image pickup camera 151 has a view field 1511 as indicated in FIG. 17 having a point to be recognized such as, e.g., the first detection point 2232 for recognition at a center position of the view field. The recognition device 150 can obtain a coordinate position of the point to be recognized if the point to be recognized is included in a cell 1512 for rough recognition inside the view field 1511 and, moreover, in a cell 1513 for fine recognition in the cell 1512.

In starting the wafer mark recognition operation, the image pickup camera 151 is positioned on the basis of coordinate data of the first detection point 2232 for recognition. However, the first detection point 2232 for recognition is not always included in the view field 1511 when the image pickup camera 151 first images the semiconductor wafer 201 because of a displacement or the like of the semiconductor wafer 201 when loaded on the wafer stage 1111. Therefore, it is determined in step 31 whether or not the first detection point 2232 for recognition can be recognized by the recognition device 150. When the detection point can be recognized, the process moves to the next step 34. The step moves to step 32 if the detection point cannot be recognized.

If a true point to be recognized (i.e., the above first detection point 2232 for recognition) is present outside a maximum deviation area 1514 defined by four points with coordinates positions having a maximum range of ±x in the X direction and a maximum range of ±y in the Y direction from a center position of the view field 1511 to which the image pickup camera is positioned, it is impossible to recognize the first detection point 2232, necessitating shifting the view field 1511. The maximum deviation area 1514 is a region beyond the view field 1511.

Figure 18:
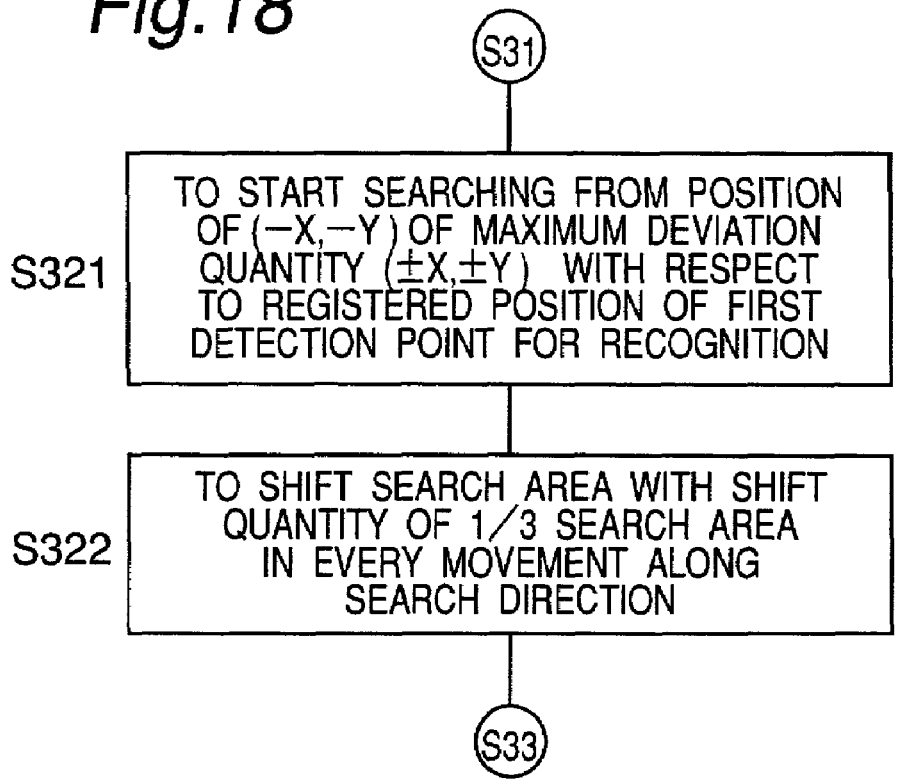
FIG. 18 is a flow chart for explaining one search operation carried out in step 32 in FIG. 3.
Figure 19:
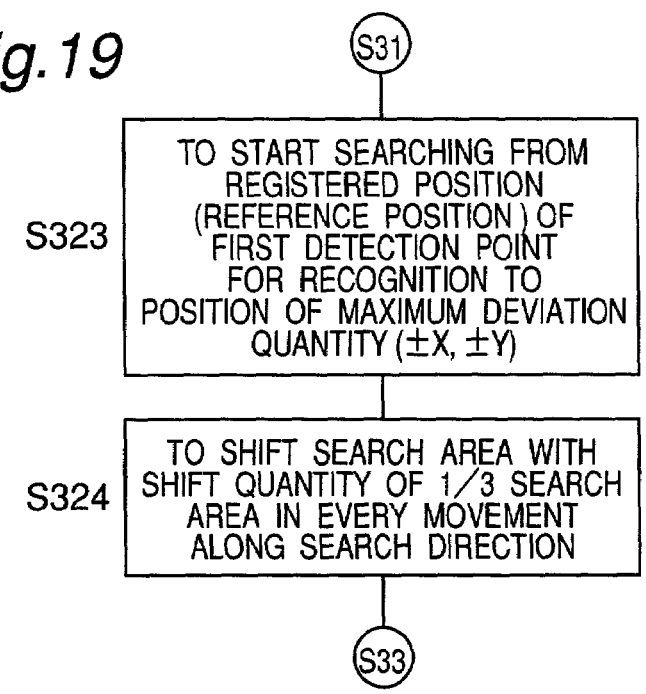
FIG. 19 is a flow chart for explaining another search operation carried out in step 32 in FIG. 3.
Figure 20:
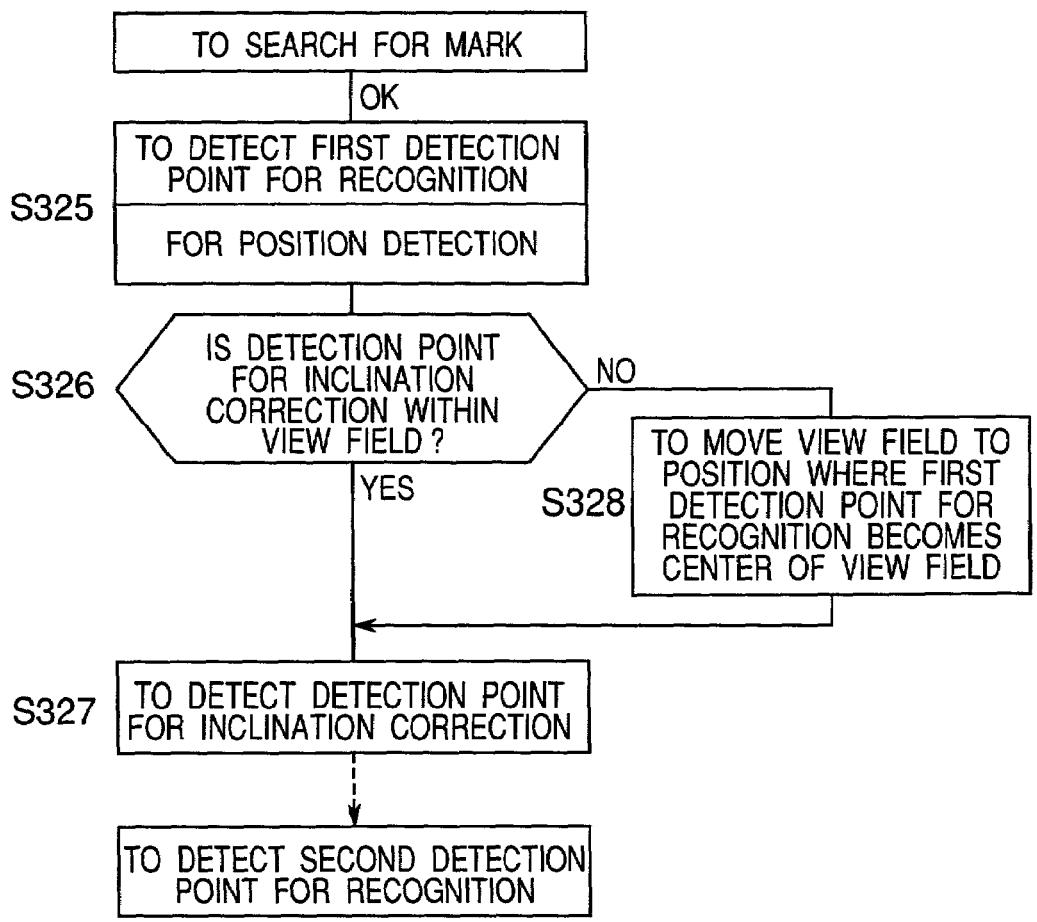
FIG. 20 is a flow chart for explaining a different search operation carried out in step 32 in FIG. 3.

In step 32, one of three operations, that is, an operation of searching for the first detection point 2232 shown in FIG. 18 or 19 (steps 321–322 and steps 323–324), an operation of searching for the first detection point 2232, and an operation of facilitating recognizing a second detection point both of which are shown in FIG. 20 (steps 325–328) is carried out. Each of these operations will be described below.

Figure 21:
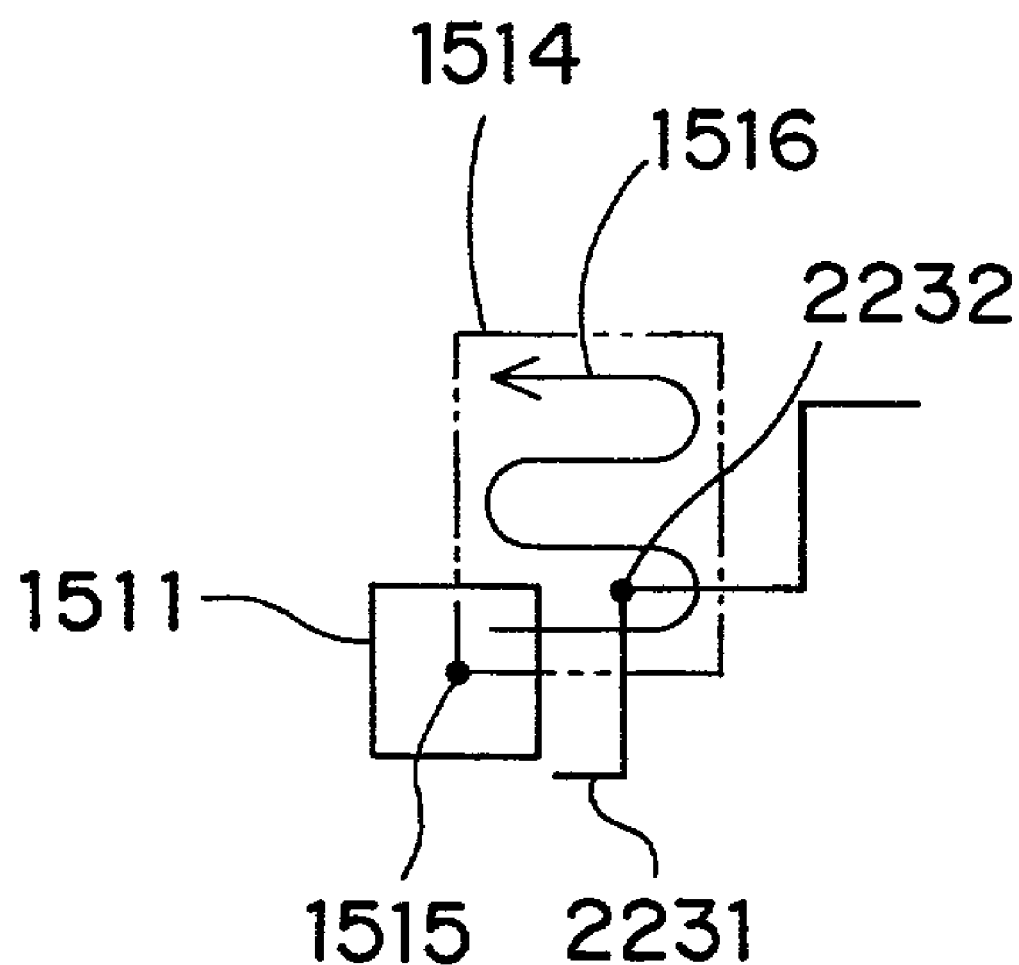
FIG. 21 is a diagram for explaining the search operation in FIG. 18.

In the search operation for the first detection point 2232 shown in FIG. 18, in step 321, the image pickup camera 151 starts the recognition operation from a search start position 1515 of (−x, −y) which are a coordinates showing one point among four corners defining the maximum deviation area 1514 as shown in FIG. 21 on the basis of the coordinates of the first detection point 2232 registered beforehand in the bump formation program.

As mentioned before, the position of the preliminarily registered first detection point 2232 is normally not coincident with the center position of the view field 1511 because of the displacement or the like of the semiconductor wafer 201 when loaded, as is clearly shown in FIG. 21.

Although the search start position 1515 is set to the coordinates (−x, −y) in the embodiment, the position is not limited to this and may be the other three points of the four corners forming the maximum deviation area 1514.

The first detection point 2232 is searched for in next step 322 while the image pickup camera 151 is moved by an incremental move distance 1517 along the X and Y directions in a serpentine search direction 1516 within the maximum deviation area 1514 from the above search start position 1515, for instance, by a predetermined distance along the X direction, then by a predetermined distance along the Y direction, then by a predetermined distance along the opposite direction to the X direction, by a predetermined distance along the Y direction again and then by a predetermined distance again in the X direction.

Figure 22:
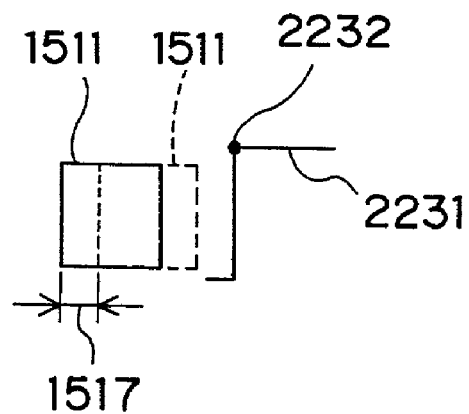
FIG. 22 is a diagram for explaining a quantity of move of the view field in the search operation of FIG. 18.

The move distance 1517 is set to be a distance corresponding to ⅓ a length in the X or Y direction of the view field 1511 in the embodiment as indicated in FIG. 22.

The way of moving the image pickup camera 151 in the serpentine fashion facilitates recognizing the search operation and its area and setting the maximum deviation area 1514.

In the search operation in the steps 321, 322, the search start position 1515 for the first detection point 2232 is set to (−x, −y) which are the position coordinates of one point among four points forming the maximum deviation area 1514. Meanwhile, in the search operation for the first detection point 2232 indicated in FIG. 19, a search start position 1519 is set to the coordinates of the center of the view field 1511 to search the inside of the maximum deviation area 1514 in step 323.

Figure 23:
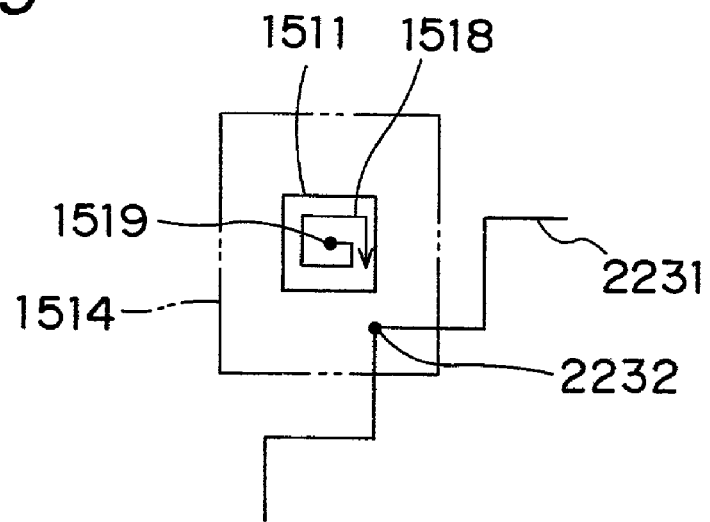
FIG. 23 is a diagram for explaining the search operation of FIG. 19.

In next step 324, as shown in FIG. 23, the first detection point 2232 is searched for while the image pickup camera 151 is moved by the above incremental move distance 1517 along a search direction 1518 nearly spirally inside the maximum deviation area 1514 from the search start position 1519. The move distance 1517 is set to the distance corresponding to ⅓ the length in the X or Y direction of the view field 1511 in step 324 as well as in step 322.

The above manner of moving the image pickup camera 151 nearly spirally enables the first detection point 2232 to be detected early as compared with the method of moving the image pickup camera in the serpentine way if the first detection point 2232 is highly possibly present in the vicinity of the center of the view field 1511 Moreover, when a region inside the view field 1511 where the first detection point 2232 is highly possibly present is already known, the first detection point 2232 can be detected early by moving the image pickup camera 151 spirally starting from a point within the region of the high possibility.

A combined movement method of the above-described serpentine movement and spiral movement may also be adopted.

The search operation in steps 325–328 will be discussed here, in which the first detection point 2232 is recognized in step 325 based on the search operation of steps 321–322 and steps 323–324.

Figure 24:
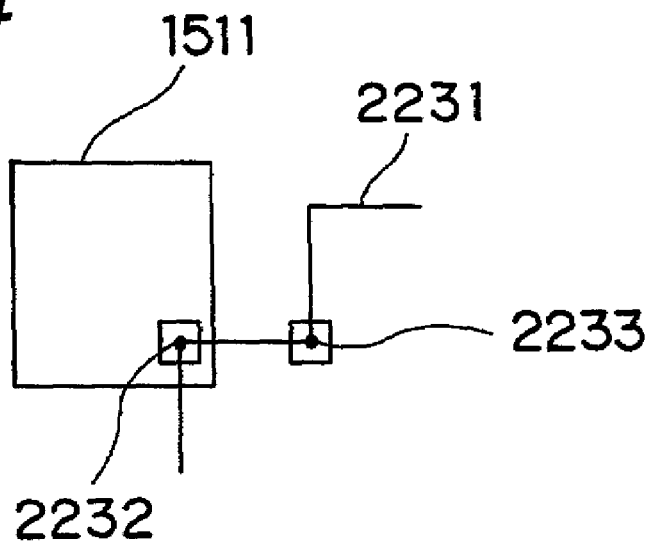
FIG. 24 is a diagram for explaining the search operation of FIG. 20.

In the next step 326, it is determined whether or not a detection point for inclination correction which corresponds to an example of the mark for detection is present inside the view field 1511. The detection point for inclination correction is an arbitrary characteristic point on the semiconductor wafer 201 present inside the view field 1511 having the first detection point 2232 at the center thereof, and is preliminarily registered in the bump formation program. For example, as shown in FIG. 24, a corner part on the outline 2231 of the IC formation pattern which is different from the first detection point 2232 may be set as the detection point 2233 for inclination correction. The detection point 2233 for inclination detection may be an arbitrarily shaped part in the IC 223 present inside the view field 1511 or a mark for the detection point for inclination correction may be newly formed in the IC 223. Or a mark for the detection point for inclination correction may be formed to a region inside the view field 1511 and outside the outline 231 where an aluminum film is formed.

When the detection point 2233 for inclination correction is determined to be inside the view field 1511 in above step 326, the inclination correction detection point 2233 is detected in step 327 without moving the image pickup camera 151. In contrast, if the inclination correction detection point 2233 is not present in the view field 1511 as in FIG. 24, the process moves to step 328.

Figure 25:
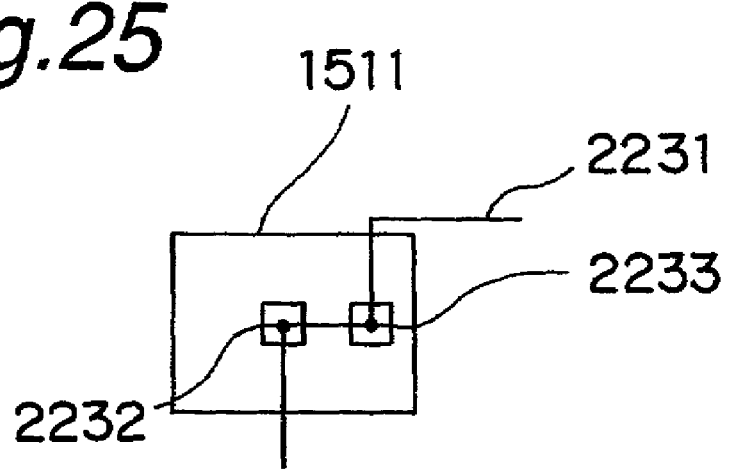
FIG. 25 is a diagram for explaining the search operation of FIG. 20.

In step 328, the image pickup camera 151 is moved to position the first detection point 2232 at the center of the view field 1511 as shown in FIG. 25 because the coordinates position of the first detection point 2232 for recognition is already known. Since the detection point 2233 for inclination correction is set to be present inside the view field 1511 in which the first detection point 2232 is present at the center of the view field 1511 as described hereinabove, the detection point 2233 for inclination correction can be caught within the view field 1511 by the above movement of the image pickup camera 151 Other than by moving the first detection point 2232 to the center of the view field 1511, the image pickup camera 151 (namely, the view field 1511) may be sequentially moved to position the first detection point 2232 sequentially to four corner parts of the view field 1511 to catch the detection point 2233.

The process then moves to the aforementioned step 327, where the detection point 2233 for inclination correction is detected.

As above, by preliminarily setting the detection point 2233 for inclination correction inside the view field 1511 centering the first detection point 2232 for recognition, not only the first detection point 2232 for recognition can be recognized, but the detection point 2233 for inclination correction can be recognized. As a result of this, the positional deviation of the ICs 223 formed on the semiconductor wafer 201 can be detected, e.g., on the basis of coordinates information of the first detection point 2232. Moreover, rough information on the angle of the inclination of the ICs 223 formed on the semiconductor wafer 201 can be obtained on the basis of the coordinates information of the first detection point 2232 for recognition and the detection point 2233 for inclination correction. A time necessary for search to be required in the recognition operation for the second detection point for recognition to be described later can be shortened or even eliminated.

Since the angle of inclination can be obtained with a higher accuracy if the inclination is obtained by detecting a position as far as possible from the first detection point 2232, recognizing the second detection point for recognition is carried out in the embodiment as described below. However, the recognition operation for the second detection point for recognition can be saved and the inclination angle obtained with the use of the detection point 2233 for inclination correction may be utilized.

Regarding the detection point 2233 for inclination correction, the corner part in the outline 2231 is set as the detection point 2233 for inclination correction in the present embodiment as described above. A shape of the detection point 2233 in the embodiment is accordingly formed of two orthogonal lines. However, the shape is not limited to the above two orthogonal lines and an arbitrary shape, e.g., a circle, a triangle, a square, a cross or the like can be selected.

Figure 26:
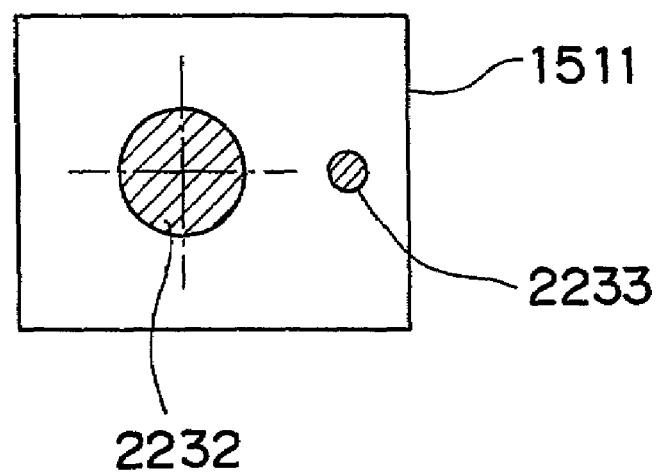
FIG. 26 is a diagram of an example of a shape of a detection point for inclination correction in the search operation of FIG. 20.
Figure 27:
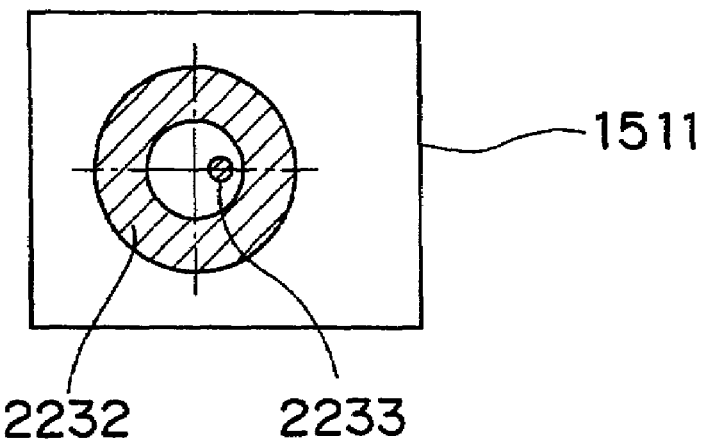
FIG. 27 is a diagram of an example of another shape of the detection point for inclination correction in the search operation of FIG. 20.

When the shape is other than a circle and if the semiconductor wafer 201 is arranged at an angle exceeding, e.g., ±5° to a normal arrangement position whereby the recognition device 150 cannot determine the inclination difference of the semiconductor wafer 201, it is difficult to recognize the inclination difference. As such, when the inclination over the above ±5° is estimated, the detection point 2233 for inclination correction is preferably made circular, for example, in a form shown in FIG. 26 or 27.

Step 32 is completed by the above operation.

It is determined in following step 33 whether or not the first detection point 2232 for recognition can be detected through the search operation in the above step 32. The process moves to the next step 34 when the detection point can be detected, whereas an error stop is determined when the detection point cannot be detected and the bump formation process is stopped.

Figure 28:
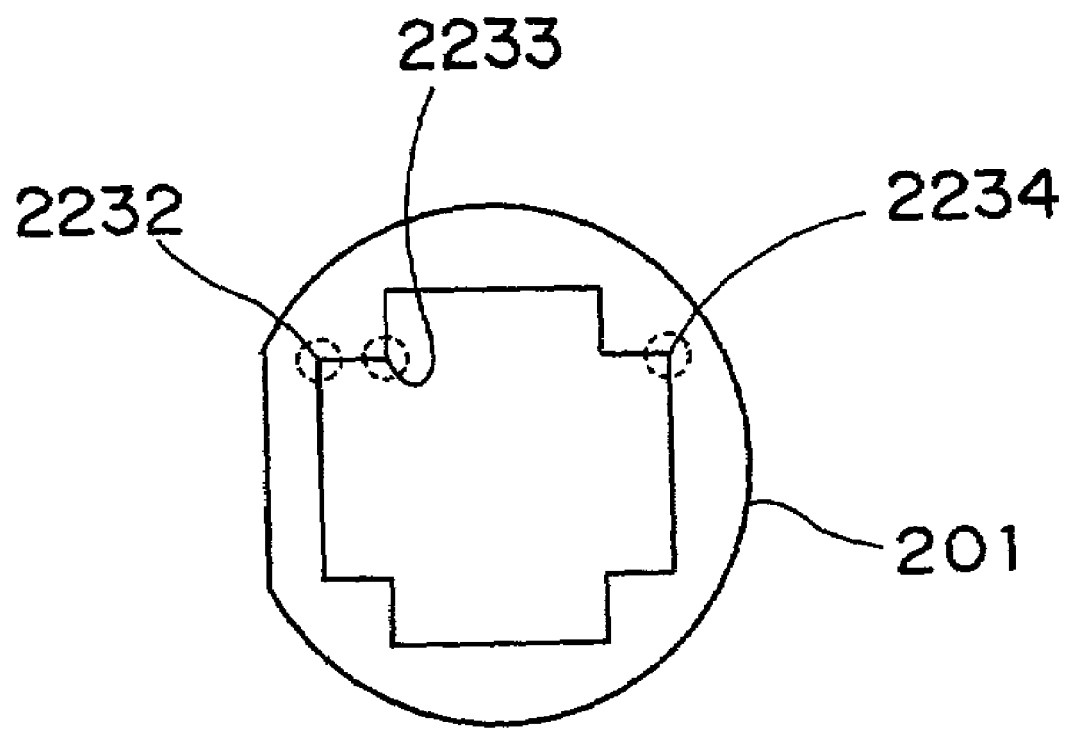
FIG. 28 is a diagram of one example of a second detection point for recognition in step 4 of FIG. 1.

In step 34 similar to above step 31, it is determined whether or not the second detection point for recognition which is a second point of characteristic points on the semiconductor wafer 201 placed on the wafer stage 1111 and corresponds to an example of the mark for detection is recognized by the image pickup camera 151 of the recognition device 150. As shown in FIG. 28, the second detection point 2234 for recognition may be set, e.g., to a corner part on the outline 2231 similar to the first detection point 2232 for recognition.

When the semiconductor wafer 201 is inclined by an amount within the above ±5° in terms of an inclination value of the semiconductor wafer 201, the first detection point 2232 for recognition and the detection point 2233 for inclination correction can be detected by moving the image pickup camera 151 in the X and Y directions. The image pickup camera 151 is then moved towards a position where the second detection point 2234 for recognition is present with the utilization of the rough information on the inclination angle obtained from the position information of the first detection point 2232 for recognition and the detection point 2233 for inclination correction. The second detection point 2234 for recognition is recognized by the same operation as in the above step 32.

On the other hand, if the amount of inclination of the semiconductor wafer 201 is over the above ±5°, the image pickup camera 151 can be moved in a manner as follows towards the position where the second detection point 2234 for recognition is present. Since the heating device 110 has the wafer turning member 111 and the turning device 112, and hence can turn the semiconductor wafer 201 by any angle as described earlier in the embodiment, the semiconductor wafer 201 is roughly positioned by the following operation. First, the image pickup camera 151 is moved while the wafer stage 1111 with the semiconductor wafer 201 thereon is turned, so that both end parts of an orientation flat of the semiconductor wafer 201 are detected. Then the wafer stage 1111 is turned to a position which corresponds to ½ coordinates obtained on the basis of the above obtained position information of the two end parts, whereby the semiconductor wafer 201 is roughly positioned. Thereafter, after recognizing the first detection point 2232 as described above, the detection point 2233 for inclination correction is detected as in the description of steps 326–328. The image pickup camera 151 is moved towards the position where the second detection point 2234 is present with the utilization of the rough information on the inclination angle obtained from these positions. The operation of roughly positioning the semiconductor wafer 201 by detecting the orientation flat may be omitted.

The operation similar to step 32 is carried out in next step 35, whereby the second detection point 2234 for recognition is recognized.

By moving the image pickup camera 151 while turning the wafer stage 1111 in the manner as described above, a quantity of the move of the image pickup camera 151 can be reduced and the recognition of the detection point 2233 for inclination correction can be sped up.

It is determined in the next step 36 whether or not the second detection point 2234 for recognition can be detected by the search operation in the above step 35. The process goes to next step 37 when the detection point can be detected. An error stop is determined when the detection point cannot be detected and the bump formation process is brought to a halt.

An angle for turning the wafer stage 1111 is obtained in step 37 on the basis of the coordinate information of the first detection point 2232 for recognition and the second detection point 2234 for recognition obtained in above steps 32, 35.

The control device 180 turns the wafer stage 1111 in the following step 38 according to the obtained turning angle. Accordingly, the row and column directions as the arrangement direction of ICs 223 in the IC formation pattern of the semiconductor wafer 201 agree with the X and Y directions. The process goes to step 1 described before.

As explained above, before step 1 is executed, the inclination difference of the IC formation pattern is detected and the quantity of the inclination is obtained, and then the semiconductor wafer 201 is turned beforehand in accordance with the quantity of the inclination. The X direction is accordingly made to agree with the row direction 221, and the Y direction is made to agree with the column direction 222. Thus, since the inclination of the basic block 230 is already corrected at a time when bumps are to be formed, it is enough to recognize only one of two marks 224 for position recognition of the basic block 230. So the recognition operation can be lessened and the productivity can be improved more.

As is detailed herein, according to the bump forming apparatus 101 and the bump formation method of the present embodiment, the number of times the recognition operation is performed is reduced in comparison with the conventional art, so that the productivity can be improved. For instance, when there are 3100 ICs formed on the semiconductor wafer and 8 bumps are to be formed to each IC, conventionally, approximately 80 minutes are required to form bumps if two marks are recognized for each IC. In contrast, the bump formation can be completed in about 38 minutes by executing the operation in above steps 31–38 and forming bumps in units of blocks as depicted above.

The productivity can hence be increased to approximately 1.5–3 times that of the conventional art according to the bump forming apparatus 101 and the bump formation method of the embodiment. In other words, if the productivity is allowed to be an equal level to a level of the conventional art, an installation area of the bump forming apparatus can be reduced to approximately $1/1.5$–$1/3$ an area of the conventional art.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of correcting inclination of ICs on a semiconductor wafer, comprising:
    loading the semiconductor wafer on a wafer turning member;
    recognizing a first detection point and a second detection point on the semiconductor wafer by moving an image pickup camera in an X direction and a Y direction orthogonal to each other; and
    correcting an inclination of all the ICs on the semiconductor wafer with respect to an X-axis and a Y-axis by rotating the semiconductor wafer in a circumferential direction thereof using the wafer turning member based on a result of said recognizing of the first detection point and the second detection point;
    wherein, when the first detection point deviates within a deviation area beyond a view field of the image pickup camera, said recognizing comprises detecting the first detection point by moving the view field of the image pickup camera in a serpentine manner in the X direction and the Y direction within the deviation area starting from a first point, the first point being one of four corners of the deviation area.

2. The method of claim 1, wherein said correcting the inclination of all the ICs on the semiconductor wafer comprises simultaneously correcting the inclination of all the ICs on the semiconductor wafer.

3. The method of claim 1, wherein said recognizing the first detection point and the second detection point comprises moving the image pickup camera intervals of movement in the X direction and the Y direction, each of the intervals of movement being equal to ⅓ of one of the X direction length of the view field and the Y direction length of the view field.

4. A method of correcting inclination of ICs on a semiconductor wafer, comprising:
 loading the semiconductor wafer on a wafer turning member;
 recognizing a first detection point and a second detection point on the semiconductor wafer by moving an image pickup camera in an X direction and a Y direction orthogonal to each other; and
 correcting an inclination of all the ICs on the semiconductor wafer with respect to an X-axis and a Y-axis by rotating the semiconductor wafer in a circumferential direction thereof using the wafer turning member based on a result of said recognizing of the first detection point and the second detection point;
 wherein, when the first detection point deviates within a deviation area beyond a view field of the image pickup camera, said recognizing comprises detecting the first detection point by moving the view field of the image pickup camera in a spiral manner in the X direction and the Y direction within the deviation area starting from a center point of the deviation area.

5. The method of claim 4, wherein said recognizing the first detection point and the second detection point comprises moving the image pickup camera intervals of movement in the X direction and the Y direction, each of the intervals of movement being equal to ⅓ of one of the X direction length of the view field and the Y direction length of the view field.

6. The method of claim 4, further comprising:
 recognizing a third detection point for inclination correction which is included in the view field of the image pickup camera with the first detection point;
 obtaining a rough inclination of the ICs based on said recognizing of the first detection point and said recognizing of the third detection point for inclination correction; and
 recognizing the second detection point by moving the image pickup camera based on the rough inclination.

7. A method of correcting inclination of ICs on a semiconductor wafer, comprising:
 loading the semiconductor wafer on a wafer turning member;
 recognizing a first detection point and a second detection point on the semiconductor wafer by moving an image pickup camera in an X direction and a Y direction orthogonal to each other;
 correcting an inclination of all the ICs on the semiconductor wafer with respect to an X-axis and a Y-axis by rotating the semiconductor wafer in a circumferential direction thereof using the wafer turning member based on a result of said recognizing of the first detection point and the second detection point;
 recognizing a third detection point for inclination correction which is included in the view field of the image pickup camera with the first detection point;
 obtaining a rough inclination of the ICs based on said recognizing of the first detection point and said recognizing of the third detection point for inclination correction; and
 recognizing the second detection point by moving the image pickup camera based on the rough inclination.

8. An apparatus for correcting an inclination of ICs on a semiconductor wafer, comprising:
 a recognition device including an image pickup camera operable to freely move above the semiconductor wafer in an X direction and a Y direction orthogonal to each other, said recognition device being operable to image a first detection point and a second detection point on the semiconductor wafer, and to detect an inclination of the ICs on the semiconductor wafer with respect to an X-axis and a Y-axis based on pickup image information obtained by said image pickup camera;
 a wafer turning member on which the semiconductor wafer is to be loaded, said wafer turning member being operable to rotate the semiconductor wafer in a circumferential direction thereof;
 a turning device for rotating said wafer turning member; and
 a control device for controlling said turning device based on inclination information of the ICs detected by said recognition device so as to rotate the semiconductor wafer loaded on said wafer turning member to thereby correct the inclination of all the ICs on the semiconductor wafer;
 wherein said control device is operable to control said recognition device such that, when the first detection point deviates within a deviation area beyond a view field of said image pickup camera, said recognition device detects the first detection point by moving the view field of said image pickup camera in a serpentine manner in the X direction and the Y direction within the deviation area starting from a first point, the first point being one of four corners of the deviation area.

9. The apparatus of claim 8, wherein said control device is operable to control said turning device so as to simultaneously correct the inclination of all the ICs on the semiconductor wafer.

10. The apparatus of claim 8, wherein said control device is operable to control said recognition device so as to move the image pickup camera intervals of movement in the X direction and the Y direction, each of the intervals of movement being equal to ⅓ of one of the X direction length of the view field and the Y direction length of the view field.

11. The apparatus of claim 8, wherein said control device is operable to control said recognition device so as to recognize a third detection point for inclination correction which is included in the view field of said image pickup camera with the first detection point, to obtain a rough inclination of the ICs based on the first detection point and the third detection point, and to detect the second detection point by moving said image pickup camera based on the rough inclination.

12. An apparatus for correcting an inclination of ICs on a semiconductor wafer, comprising:
 a recognition device including an image pickup camera operable to freely move above the semiconductor wafer in an X direction and a Y direction orthogonal to each other said recognition device being operable to image a first detection point and a second detection point on the semiconductor wafer, and to detect an inclination of the ICs on the semiconductor wafer with respect to an X-axis and a Y-axis based on pickup image information obtained by said image pickup camera;
 a wafer turning member on which the semiconductor wafer is to be loaded, said wafer turning member being operable to rotate the semiconductor wafer in a circumferential direction thereof;
 a turning device for rotating said wafer turning member; and
 a control device for controlling said turning device based on inclination information of the ICs detected by said recognition device so as to rotate the semiconductor wafer loaded on said wafer turning member to thereby correct the inclination of all the ICs on the semiconductor wafer;

wherein said control device is operable to control said recognition device such that, when the first detection point deviates within a deviation area beyond a view field of said image pickup camera, said recognition device detects the first detection point by moving the view field of said image pickup camera in a spiral manner in the X direction and the Y direction within the deviation area starting from a center point of the deviation area.

13. The apparatus of claim 12, wherein said control device is operable to control said recognition device so as to move the image pickup camera intervals of movement in the X direction and the Y direction, each of the intervals of movement being equal to ⅓ of one of the X direction length of the view field and the Y direction length of the view field.

14. The apparatus of claim 12, wherein said control device is operable to control said recognition device so as to recognize a third detection point for inclination correction which is included in the view field of said image pickup camera with the first detection point, to obtain a rough inclination of the ICs based on the first detection point and the third detection point, and to detect the second detection point by moving said image pickup camera based on the rough inclination.

15. An apparatus for correcting an inclination of ICs on a semiconductor wafer, comprising:

a recognition device including an image pickup camera operable to freely move above the semiconductor wafer in an X direction and a Y direction orthogonal to each other, said recognition device being operable to image a first detection point and a second detection point on the semiconductor wafer, and to detect an inclination of the ICs on the semiconductor wafer with respect to an X-axis and a Y-axis based on pickup image information obtained by said image pickup camera;

a wafer turning member on which the semiconductor wafer is to be loaded, said wafer turning member being operable to rotate the semiconductor wafer in a circumferential direction thereof;

a turning device for rotating said wafer turning member; and a control device for controlling said turning device based on inclination information of the ICs detected by said recognition device so as to rotate the semiconductor wafer loaded on said wafer turning member to thereby correct the inclination of all the ICs on the semiconductor wafer;

wherein said control device is operable to control said recognition device so as to recognize a third detection point for inclination correction which is included in the view field of said image pickup camera with the first detection point, to obtain a rough inclination of the ICs based on the first detection point and the third detection point, and to detect the second detection point by moving said image pickup camera based on the rough inclination.

* * * * *